United States Patent
Nakao et al.

(10) Patent No.: US 11,899,070 B2
(45) Date of Patent: Feb. 13, 2024

(54) BATTERY CONTROL DEVICE

(71) Applicant: Vehicle Energy Japan Inc., Hitachinaka (JP)

(72) Inventors: Ryohhei Nakao, Tokyo (JP); Hiroshi Morikawa, Hitachinaka (JP); Masashi Naitoh, Hitachinaka (JP); Masafumi Shiwa, Hitachinaka (JP); Fanny Matthey, Tokyo (JP)

(73) Assignee: VEHICLE ENERGY JAPAN INC., Hitachinaka (JP)

( * ) Notice: Subject to any disclaimer, the term of this patent is extended or adjusted under 35 U.S.C. 154(b) by 305 days.

(21) Appl. No.: 17/288,789

(22) PCT Filed: Oct. 9, 2019

(86) PCT No.: PCT/JP2019/039875
§ 371 (c)(1),
(2) Date: Apr. 26, 2021

(87) PCT Pub. No.: WO2020/085097
PCT Pub. Date: Apr. 30, 2020

(65) Prior Publication Data
US 2022/0003819 A1    Jan. 6, 2022

(30) Foreign Application Priority Data

Oct. 26, 2018   (JP) ................ 2018-201526

(51) Int. Cl.
*G01R 31/382*   (2019.01)
*G01R 31/367*   (2019.01)
(Continued)

(52) U.S. Cl.
CPC ........... *G01R 31/382* (2019.01); *B60L 58/10* (2019.02); *G01R 31/367* (2019.01);
(Continued)

(58) Field of Classification Search
CPC .................... G01R 31/382; G01R 31/367
(Continued)

(56) References Cited

U.S. PATENT DOCUMENTS

2009/0276172 A1* 11/2009 Nishi ............... G01R 31/367
702/63
2010/0033132 A1   2/2010 Nishi et al.
(Continued)

FOREIGN PATENT DOCUMENTS

| CN | 101512827 A | 8/2009 |
| EP | 2 107 385 A1 | 10/2009 |
| JP | 2013-137935 A | 7/2013 |

OTHER PUBLICATIONS

International Search Report issued in international application No. PCT/JP2019/039875 dated Nov. 5, 2019.
(Continued)

*Primary Examiner* — Ricky Go
(74) *Attorney, Agent, or Firm* — FOLEY & LARDNER LLP

(57) ABSTRACT

An appropriate upper limit current value is set in consideration of steep change in battery voltage in a high-current region caused by the ion concentration gradient in a diffusion layer formed around an interface between an electrode and an electrolyte. An upper limit current calculator 152 includes: a concentration gradient estimator 1523 that estimates a lithium ion concentration gradient in a diffusion layer formed around an interface between an electrode and an electrolyte of a battery, based on a current flowing in the battery, or on the current and a temperature; and an upper limit current determiner 1524 that determines an upper limit current value of the battery, based on the lithium ion concentration gradient. The upper limit current determiner 1524 determines the upper limit current value such that an
(Continued)

overvoltage of the battery according to the lithium ion concentration gradient falls within a predetermined range.

11 Claims, 29 Drawing Sheets

(51) Int. Cl.
*G01R 31/374* (2019.01)
*B60L 58/10* (2019.01)
*G01R 31/36* (2020.01)
*H01M 10/44* (2006.01)
*H01M 10/48* (2006.01)
*H02J 7/00* (2006.01)

(52) U.S. Cl.
CPC ....... *G01R 31/3648* (2013.01); *G01R 31/374* (2019.01); *H01M 10/44* (2013.01); *H01M 10/48* (2013.01); *H01M 10/486* (2013.01); *H02J 7/0047* (2013.01); *B60L 2240/545* (2013.01); *B60L 2240/547* (2013.01); *B60L 2240/549* (2013.01)

(58) Field of Classification Search
USPC .......................................................... 702/63
See application file for complete search history.

(56) References Cited

U.S. PATENT DOCUMENTS

| 2010/0085015 A1* | 4/2010 | Hamaguchi ....... H01M 10/0525 320/134 |
| 2010/0204861 A1* | 8/2010 | Kaita ................ H02J 7/007188 320/133 |
| 2012/0025773 A1* | 2/2012 | Wang .................. H02J 7/00714 320/129 |
| 2021/0013731 A1* | 1/2021 | Choe .................... B60L 53/302 |

OTHER PUBLICATIONS

Extended European Search Report dated Oct. 20, 2022 issued in EP Application No. 19877305.3, 8 pages.

Notification of First Office Action dated Apr. 29, 2023 issued in CN Application No. 201980071325.X, with English translation, 11 pages.

\* cited by examiner

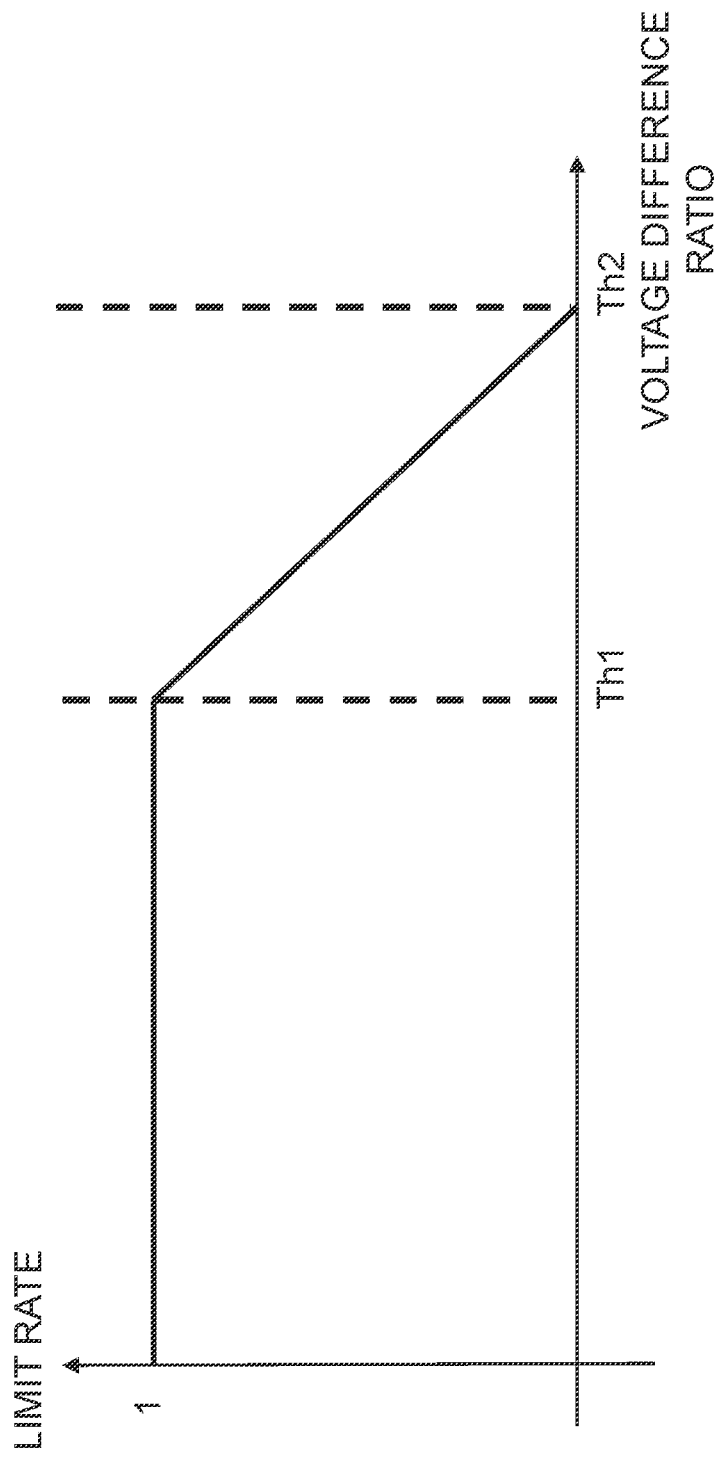

BATTERY CONTROL DEVICE

TECHNICAL FIELD

The present invention relates to a battery control apparatus.

BACKGROUND ART

Typically, battery systems mounted on electric vehicles (EVs), plug-in hybrid electric vehicles (PHEVs), hybrid electric vehicles (HEVs) and the like include multiple secondary batteries coupled to each other in series or in parallel, and various electric components. The electric components include relays for controlling turning on and off of electric coupling between the batteries and loads, sensors for measuring the currents and voltages of the batteries, and a battery control apparatus that controls charge and discharge of the batteries.

The battery control apparatus sets a limit value (upper limit current value) for currents flowing in the batteries in order to use the batteries in an appropriate range, and controls charge and discharge of the batteries in the range of the upper limit current value. Accordingly, use in a high-current region where the voltages of the batteries steeply change is avoided, thus suppressing deterioration of the batteries.

The reason of steep change in battery voltages in the high-current region is as follows. For example, in a case where typical lithium ion batteries are used as secondary batteries, occurrence of a concentration gradient of lithium ions in each diffusion layer formed around an interface between an electrode and an electrolyte requires a high overvoltage for supplying lithium ions from the electrolyte to the electrode during high-current energization. Consequently, to avoid use of the batteries in the high-current region, it is preferable that the battery control apparatus appropriately define an upper limit current value according to the lithium ion concentration gradient that is in the diffusion layer around the interface between the electrode and the electrolyte and variously changes according to charge and discharge.

As to the method of controlling current in a secondary battery in consideration of the ion concentration of an electrolyte, a technology described in Patent Literature 1 has been known. Patent Literature 1 discloses the technology that calculates an evaluation value indicating the deviation of ion concentration on the basis of the value of current flowing in the secondary battery, and reduces the upper limit value for the discharging power of the secondary battery when the evaluation value exceeds a target value.

CITATION LIST

Patent Literature

[Patent Literature 1] Japanese Patent Laid-Open No. 2013-137935

SUMMARY OF INVENTION

Technical Problem

The technology described in Patent Literature 1 does not consider the ion concentration gradient in the diffusion layer formed around the interface between each electrode and the electrolyte. Accordingly, the upper limit current value in consideration of steep change in battery voltage in the high-current region as described above cannot be set.

Solution to Problem

A battery control apparatus according to the present invention includes: a concentration gradient estimator that estimates an ion concentration gradient in a diffusion layer formed around an interface between an electrode and an electrolyte of a secondary battery, based on a current flowing in the secondary battery, or on the current and a temperature of the secondary battery; and an upper limit current determiner that determines an upper limit current value of the secondary battery, based on the ion concentration gradient, wherein the upper limit current determiner determines the upper limit current value such that an overvoltage of the secondary battery according to the ion concentration gradient falls within a predetermined range.

Advantageous Effects of Invention

According to the present invention, an appropriate upper limit current value can be set in consideration of steep change in battery voltage in the high-current region caused by the ion concentration gradient in the diffusion layer formed around the interface between each electrode and the electrolyte.

BRIEF DESCRIPTION OF DRAWINGS

FIG. 29 shows an example of the relationship between the voltage difference ratio and the limit rate.

DESCRIPTION OF EMBODIMENTS

Hereinafter, embodiments of the present invention are described with reference to the drawings. The following embodiments are described using an example of a case where the present invention is applied to a battery system constituting a power source of a plug-in hybrid electric vehicle (PHEV). However, the configuration of each embodiment described below is not limited thereto, and is applicable also to electric storage control circuits of electric storage apparatuses that constitute power sources of automobiles, such as hybrid electric vehicles (HEVs) and electric vehicles (EVs), and industrial vehicles, such as hybrid railroad vehicles.

In the following embodiments, description is made using an example of a case where lithium ion batteries are adopted. Alternatively, any of nickel-metal-hydride batteries, lead batteries, electric double layer capacitors, hybrid capacitors and the like can be adopted, only if the batteries are chargeable and dischargeable secondary batteries. Furthermore, in the following embodiments, an assembled battery is configured by coupling multiple unit batteries in series. Alternatively, assemblies each including multiple unit batteries coupled in parallel may be further coupled in series to constitute an assembled battery. Assemblies each including multiple unit batteries coupled in series may be further coupled in parallel to constitute an assembled battery.

First Embodiment

Figure 1:
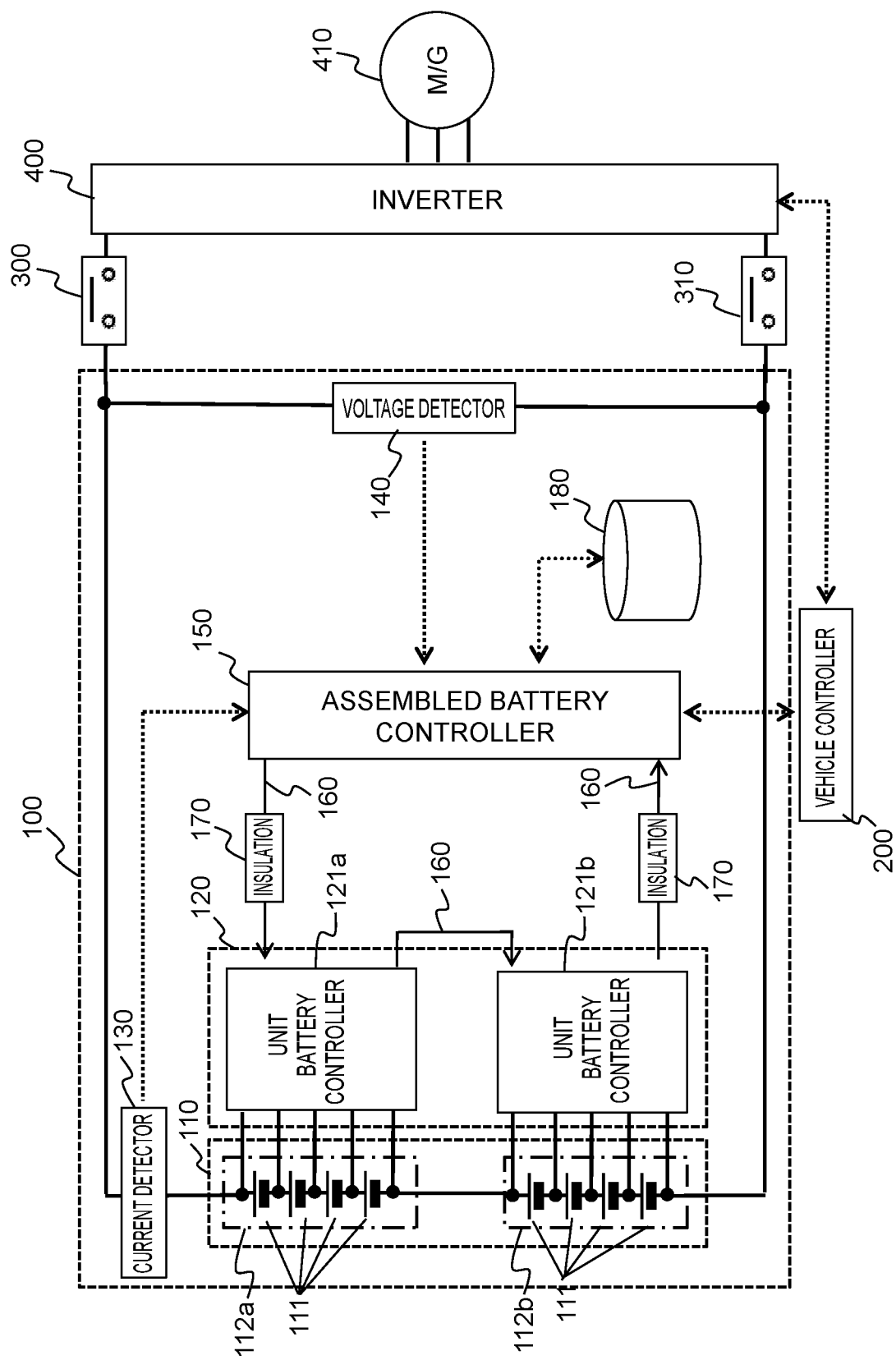
FIG. 1 shows a configuration of a battery system and therearound according to an embodiment of the present invention.

FIG. 1 shows a configuration of a battery system 100 and therearound according to an embodiment of the present invention. The battery system 100 is coupled to an inverter 400 via relays 300 and 310. The battery system 100 includes an assembled battery 110, a unit battery manager 120, a current detector 130, a voltage detector 140, an assembled battery controller 150, and a storage 180.

The assembled battery 110 includes multiple unit batteries 111. The unit battery manager 120 monitors the states of the unit batteries 111. The current detector 130 detects the current flowing in the battery system 100. The voltage detector 140 detects the total voltage of the assembled battery 110. The assembled battery controller 150 detects the state of the assembled battery 110, and further manages the state and the like.

The assembled battery 110 is configured by electrically coupling in series the multiple unit batteries 111 that can accumulate and discharge electric energy (charge and discharge of direct current power). For example, a lithium ion battery having an output voltage of 3.0 to 4.2 V (average output voltage: 3.6 V) is adopted as each unit battery 111. Note that what has another voltage specification may be adopted instead. The unit batteries 111, which constitute the assembled battery 110, are grouped into groups each including a predetermined number of units in view of achieving state management and control. The grouped unit batteries 111 are electrically coupled to each other in series to constitute unit battery groups 112a and 112b. The numbers of unit batteries 111 constituting the respective unit battery groups 112 may be the same among all the unit battery groups 112. Alternatively, the number of unit batteries 111 may be different among individual unit battery groups 112.

The unit battery manager 120 monitors the states of the unit batteries 111 constituting the assembled battery 110. The unit battery manager 120 includes unit battery controllers 121 provided for the respective unit battery groups 112. In FIG. 1, the unit battery controllers 121a and 121b are provided for the respective unit battery groups 112a and 112b. Each unit battery controller 121 monitors and controls the states of the unit batteries 111 constituting the corresponding unit battery group 112.

In this embodiment, to simplify the description, four unit batteries 111 are electrically coupled in series to constitute each of the unit battery groups 112a and 112b, and the unit battery groups 112a and 112b are further electrically coupled in series to constitute the assembled battery 110, which includes total eight unit batteries 111.

The assembled battery controller 150 receives measurement values of battery voltages and temperatures of the unit batteries 111 output from the unit battery manager 120, a current value from the current detector 130, the total voltage value of the assembled battery 110 output from the voltage detector 140, and battery characteristic information on the unit batteries 111 stored in the storage 180. The unit battery manager 120 has a function of diagnosing whether the unit batteries 111 are overcharged or overdischarged, and a function of outputting an abnormality signal in case a communication error or the like occurs at the unit battery manager 120. These diagnosed results and abnormality signal are also input into the assembled battery controller 150. Furthermore, signals are input also from a vehicle controller 200, which is a higher-level control apparatus.

The assembled battery controller 150 performs calculation for appropriately controlling charge and discharge of the assembled battery 110, on the basis of the input information, and of the current limit value and the battery characteristics of the unit batteries 111, which are preliminarily stored in the storage 180. For example, this controller executes calculation of the limit value of the charging and discharging power for each unit battery 111, calculation of the state of charge (SOC: State Of Charge) and the deterioration state (SOHR: State Of Health based on Resistance) of each unit battery 111, and calculation for performing voltage equalization control of each unit battery 111. The assembled battery controller 150 outputs these calculation results, and instructions based on the calculation results, to the unit battery manager 120 or the vehicle controller 200.

The storage 180 stores information about the battery characteristics of the assembled battery 110, the unit batteries 111 and the unit battery groups 112. Note that this embodiment has the configuration where the storage 180 is installed outside of the assembled battery controller 150 or the unit battery manager 120. Alternatively, a configuration may be adopted where the assembled battery controller 150 or the unit battery manager 120 includes a storage, in which the information may be stored.

The assembled battery controller 150 and the unit battery manager 120 transmit and receive signals, via insulation elements 170 and pieces of signal communication means 160, which are typified by photocouplers. The insulation elements 170 are provided because the assembled battery controller 150 and the unit battery manager 120 have different operation power sources. That is, the unit battery manager 120 receives power from the assembled battery 110 and operates, while the assembled battery controller 150 uses a battery (e.g., 14-V-series battery) for vehicle-mounted auxiliary devices. The insulation elements 170 may be implemented on a circuit board that constitutes the unit battery manager 120, or implemented on a circuit board that constitutes the assembled battery controller 150. In certain system configurations, the insulation elements 170 may be omitted.

Communication means between the assembled battery controller 150 and the unit battery controllers 121a and 121b, which constitute the unit battery manager 120, is described. The unit battery controllers 121a and 121b are coupled to the unit battery groups 112a and 112b, which the respective controllers monitor, in series, in a descending order of potential. A signal transmitted by the assembled battery controller 150 to the unit battery manager 120 is input into the unit battery controller 121a via the insulation element 170 and the signal communication means 160. The output of the unit battery controller 121a is input into the unit battery controller 121b via the signal communication means 160. The output of the lowest unit battery controller 121b is transmitted to the assembled battery controller 150 via the insulation element 170 and the signal communication means 160. In this embodiment, no insulation element 170 intervenes between the unit battery controller 121a and the unit battery controller 121b. Alternatively, the signal may be transmitted and received via an insulation element 170.

The vehicle controller 200 controls the inverter 400, which is coupled to the battery system 100 via the relays 300 and 310, using information transmitted from the assembled battery controller 150. During vehicle traveling, the battery system 100 is coupled to the inverter 400, and drives a motor generator 410 using the energy accumulated in the assembled battery 110.

When a vehicle system mounted with the battery system 100 is started and travels, the battery system 100 is coupled to the inverter 400 under control of the vehicle controller 200 to drive the motor generator 410 using the energy accumulated in the assembled battery 110, and during regeneration, the assembled battery 110 is charged by power generated by the motor generator 410. The energy accumulated in the assembled battery 110 by charging is used for next vehicle traveling, or also for operating electric components and the like in and out of the vehicle.

Figure 2:
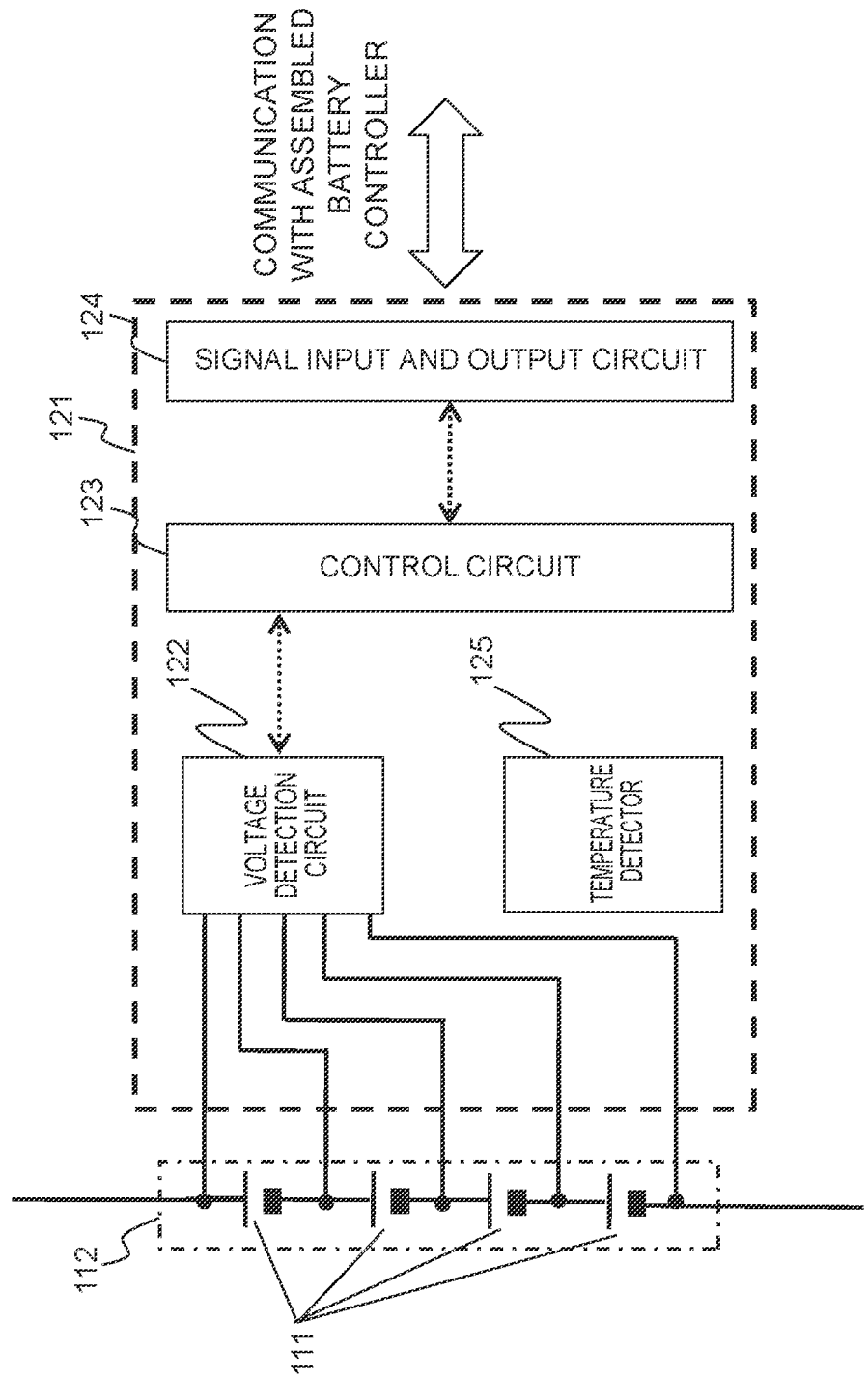
FIG. 2 shows a circuit configuration of a unit battery controller.

FIG. 2 shows the circuit configuration of the unit battery controller 121. The unit battery controller 121 includes a voltage detection circuit 122, a control circuit 123, a signal input and output circuit 124, and a temperature detector 125. The voltage detection circuit 122 measures the voltage between terminals of each unit battery 111. The control circuit 123 receives measurement results from the voltage detection circuit 122 and the temperature detector 125, and transmits the results to the assembled battery controller 150 via the signal input and output circuit 124. Note that the circuit configuration that is typically implemented in the unit battery controllers 121 and equalizes the voltage and SOC variation between the unit batteries 111 that occur owing to self-discharge, variation in consumption current and the like, is determined to be well known, and description thereof is omitted.

The temperature detector 125 included in the unit battery controller 121 shown in FIG. 2 has a function of measuring the temperature of the unit battery groups 112. The temperature detector 125 measures a temperature of the unit battery groups 112 as a whole, and deals with the temperature as a temperature representative value of the unit batteries 111 constituting the unit battery groups 112. The temperature measured by the temperature detector 125 is used for various calculations for detecting the state of the unit batteries 111, the unit battery groups 112, or the assembled battery 110. FIG. 2 assumes this. Accordingly, the unit battery controller 121 is provided with the single temperature detector 125. The unit batteries 111 may be provided with respective temperature detectors 125, which measure the temperatures of the corresponding unit batteries 111, and various calculation can be executed on the basis of the individual temperatures of the unit batteries 111. However, in this case, as the number of temperature detectors 125 is large, the configuration of the unit battery controller 121 is complicated.

FIG. 2 shows the temperature detector 125 in a simplified manner. In actuality, a temperature sensor is installed on a temperature measurement target, the installed temperature sensor outputs temperature information as a voltage, a result obtained by measuring the voltage is transmitted to the signal input and output circuit 124 via the control circuit 123, and the signal input and output circuit 124 outputs the measurement result to the outside of the unit battery controller 121. A function of achieving this series of flow elements is implemented as the temperature detector 125 in the unit battery controllers 121. The voltage detection circuit 122 may be used to measure the temperature information (voltage).

Figure 3:
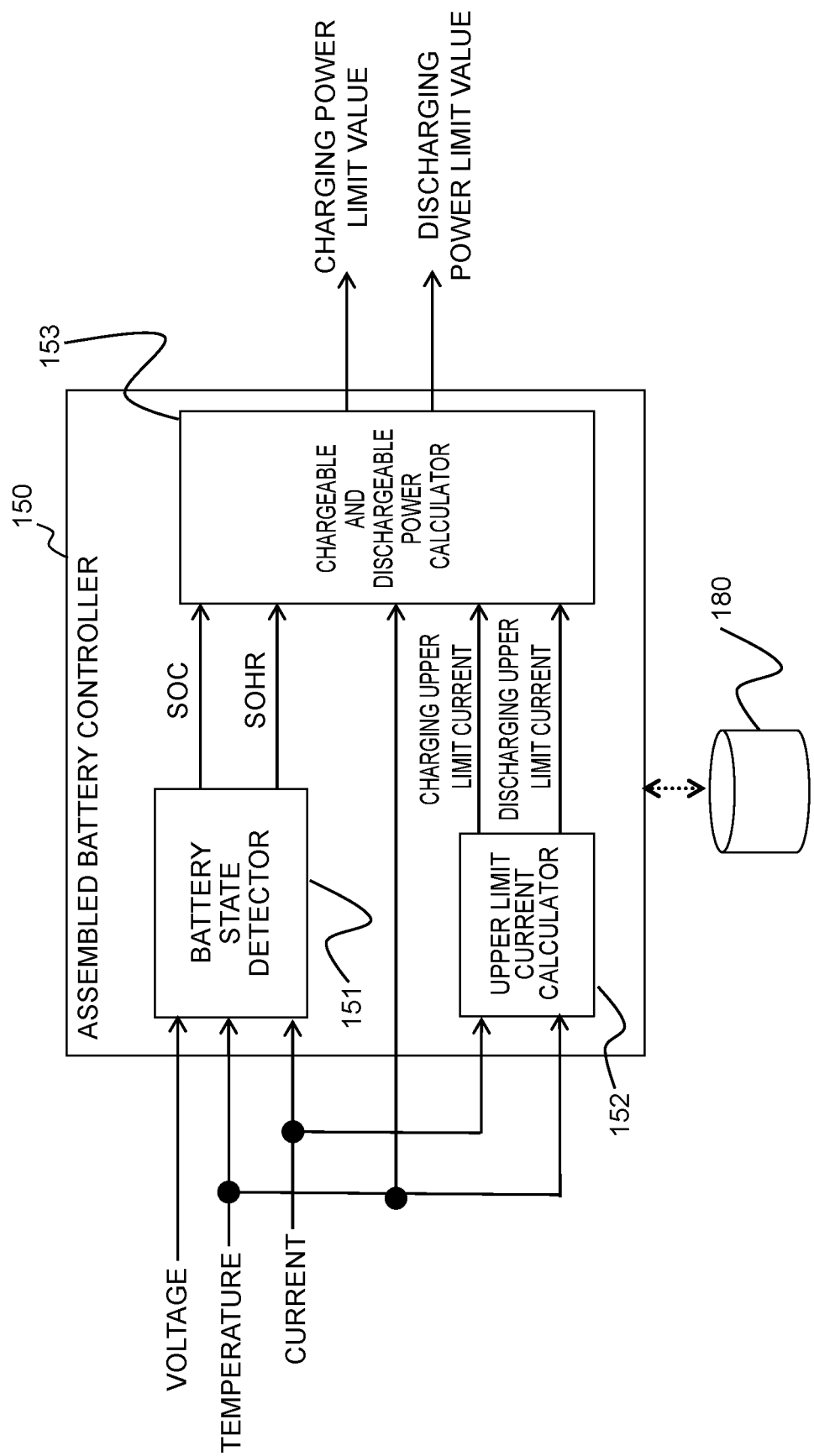
FIG. 3 shows a functional configuration of an assembled battery controller according to a first embodiment of the present invention.

FIG. 3 shows the functional configuration of the assembled battery controller 150 according to the first embodiment of the present invention. The assembled battery controller 150 is a component that determines the state of each unit battery 111 in the assembled battery 110 and power allowed to be input into and output from each unit battery 111 on the basis of the current value and voltage value of each unit battery 111 detected during vehicle traveling, and has a function, as a functional configuration element, of calculating charging and discharging power limit values (a charging power limit value and a discharging power limit value) for limiting the charging and discharging powers of each unit battery 111. FIG. 3 shows the functional configuration of the assembled battery controller 150 pertaining to the calculation of the charging and discharging power limit values. This is a component of having a function corresponding to the battery control apparatus according to an embodiment of the present invention. Note that the assembled battery controller 150 has not only the function of calculating the charging and discharging Power limit values, but also various functions required to control the assembled battery 110, for example, the function of equalizing the voltages of the unit batteries 111. However, these functions are well known, and are not directly related to the present invention. Accordingly, detailed description thereof is omitted in the following description.

As shown in FIG. 3, the assembled battery controller 150 includes, as its functions, functional blocks that are a battery state detector 151, an upper limit current calculator 152, and a chargeable and dischargeable power calculator 153. Through these functional blocks, the assembled battery controller 150 calculates the charging and discharging power limit values of each unit battery 111 on the basis of the current of the assembled battery 110 detected by the current detector 130, that is, the current of each unit battery 111, and of the voltage and temperature of each unit battery 111 detected by the unit battery manager 120.

Note that the description has been made such that the assembled battery controller 150 calculates the charging and discharging power limit values of each unit battery 111. Alternatively, multiple unit batteries 111 may be collectively dealt with, and the charging and discharging power limit values may be calculated. For example, calculation may be made with respect to each of the unit battery groups 112*a* and 112*b*, or calculation may be made for the entire assembled battery 110. Also in such cases, the charging and discharging power limit values can be calculated by a process identical or similar to that for the unit battery 111. The charging and discharging power limit values of each unit battery 111 can be calculated by an identical or similar process. Accordingly, in the following description, the calculation target of the charging and discharging power limit values is simply called "battery", and the function of calculating the charging and discharging power limit values in the assembled battery controller 150 is described.

The battery state detector 151 calculates the SOC and SOHR of each battery on the basis of information on the current, voltage and temperature of each battery, which is input into the assembled battery controller 150. Note that the method of calculating the SOC and SOHR is assumed to be publicly known, and description thereof is omitted.

The upper limit current calculator 152 receives the current and temperature of each battery, and calculates and outputs the charging upper limit current that defines the upper limit current during charging of each battery, and the discharging upper limit current that defines the upper limit current during discharging of each battery. Note that a specific method of calculating the charging upper limit current and the discharging upper limit current by the upper limit current calculator 152 is described later.

The chargeable and dischargeable power calculator 153 calculates the chargeable power and the dischargeable power of each battery on the basis of the SOC and SOHR of each battery calculated by the battery state detector 151, the temperature of each battery input into the assembled battery controller 150, and the charging upper limit current and the discharging upper limit current of each battery calculated by the upper limit current calculator 152, and outputs the charging power limit value and the discharging power limit value of each battery on the basis of the calculation results. Note that the method of calculating the chargeable power and the dischargeable power is described later.

Subsequently, a specific method of calculating the charging upper limit current and the discharging upper limit current by the upper limit current calculator 152 is described with reference to FIGS. 4 to 9.

Figure 4:
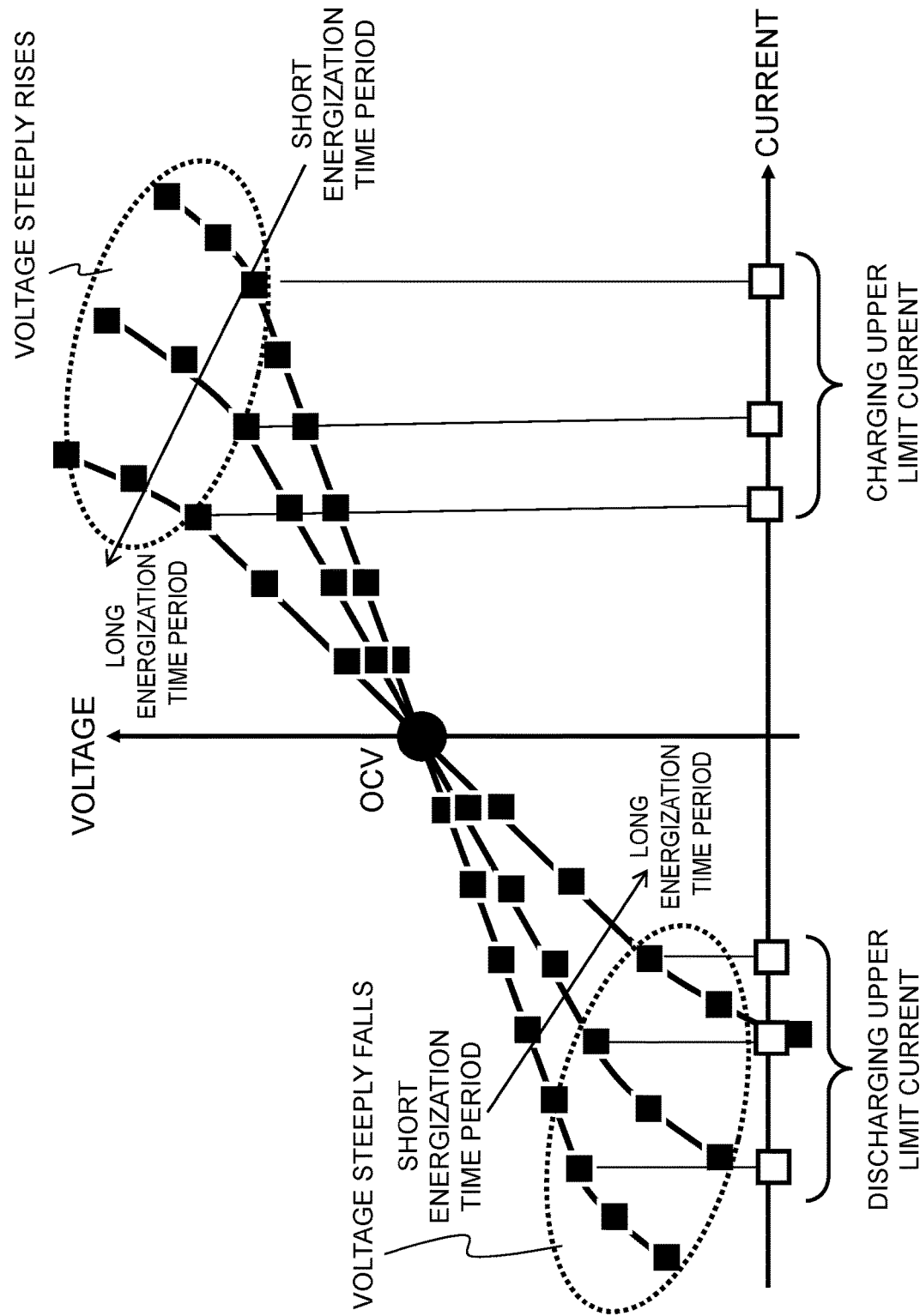
FIG. 4 illustrates a definition of an upper limit current.

FIG. 4 illustrates a definition of an upper limit current. FIG. 4 shows an example of a graph where the voltage of the battery a predetermined time period after continuous energization to the battery with a certain current, with the magnitude of current being changed in a charging direction and a discharging direction. The abscissa axis of FIG. 4 indicates the current, and the ordinate axis indicates the voltage. In FIG. 4, plot points respectively indicated by squires reside on three curves. These three curves each indicate timing when the voltage is measured, i.e., that the elapsed time period after start of energization to the battery is different.

Typically, in a case of continuous energization to the battery with a certain current, the internal resistance increases as the energization time period elapses. Accordingly, the voltage of the battery gradually deviates from OCV. That is, the longer the energization time period is, the higher the internal resistance value is. Here, as shown in FIG. 4, it is known that a region where the voltage steeply changes in charging and in discharging appears when the current flowing in the battery exceeds a certain current value. The region corresponds to a region where diffusion of lithium ions to the interface between each electrode and the electrolyte in the battery limits the speed. That is, in this region, increase in resistance component caused by the diffusion of lithium ions steeply changes the voltage of the battery.

In the region where diffusion of lithium ions limits the speed as described above, continuous use of the battery possibly results in reduction in input and output performance. Accordingly, it is preferable to avoid use of the battery in this region as much as possible. In this embodiment, the current immediately before entering this region is defined as the upper limit current in the upper limit current calculator 152. The current value at this time is set as the upper limit current value, thereby avoiding use of the battery in this region.

However, in the graph in FIG. 4, the magnitude of current transitioning to the region where diffusion of lithium ions limits the speed is different on a curve-by-curve basis. Accordingly, the magnitude of current to be set as the upper limit current value is variously different according to the difference in energization time period. Such dependency of the upper limit current on the energization time period is described below with reference to FIG. 5.

Figure 5:
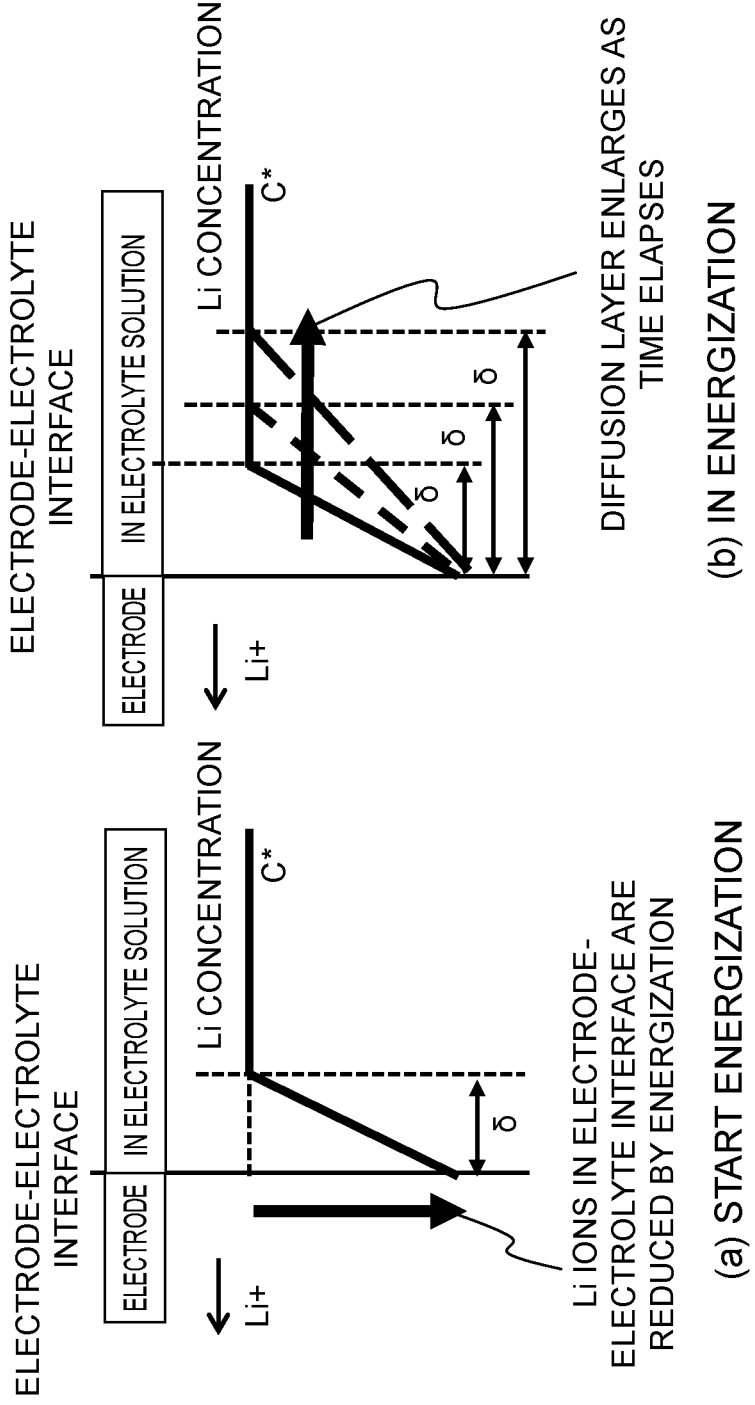
FIG. 5 schematically shows a lithium ion concentration distribution around the interface between an electrode and an electrolyte.

FIG. 5 schematically shows a lithium ion concentration distribution around an interface between an electrode and an electrolyte. FIG. 5(*a*) shows the situation of the distribution of concentrations of lithium ions around a positive electrode immediately after start of discharging of the battery. In this case, the lithium ion concentration at the interface between the positive electrode and the electrolyte is lower, by what corresponds to the current flowing in the battery, than the concentration at an offshore position sufficiently apart from the interface between the electrode and the electrolyte in the electrolyte solution (the lithium ion concentration in an equilibrium state without charge or discharge; C* in FIG. 5). At this time, a distribution of concentrations of lithium ions occurs around the interface, and lithium ions diffuse from the electrolyte solution with a high concentration to the interface with a low concentration. The distance required for this diffusion is hereinafter called the thickness (δ) of the diffusion layer.

FIG. 5(b) shows the situation where the concentration distribution of lithium ions around the positive electrode changes as the time elapses. If the current continuously flows after start of discharging of the battery, lithium ions are continuously consumed on the interface between the positive electrode and the electrolyte. Accordingly, as shown in FIG. 5(b), the distribution of concentrations of lithium ions is gradually enlarged as the time elapsed. As a result, the thickness of the diffusion layer increases, and the value of δ increases accordingly.

When the thickness of the diffusion layer increases as described above, a higher overvoltage is required to be applied in order to supply lithium ions to the interface from a farther apart point. That is, during discharge of the battery, the thickness of the diffusion layer increases as the energization time period elapses. As a result, the overvoltage increases. Accordingly, the internal resistance tends to increase. The tendency as described above is reflected in the steep change in voltage during energization with a high current for a long time as shown in FIG. 4.

Consequently, in the upper limit current calculator 152, in order to estimate, as the upper limit current value, the current value with which steep change in voltage in the high-current region does not occur, it is important to grasp the distribution of concentrations of lithium ions (concentration gradient) as shown in FIG. 5. That is, in order to implement, in actual control, the method of setting the upper limit current as described with reference to FIG. 4, it is required to set the upper limit current value in consideration of the distribution of concentrations of lithium ions (concentration gradient) caused by charge and discharge up to the present time point.

Note that FIG. 5 shows the distribution of concentrations of lithium ions around the positive electrode during discharge. Meanwhile, the distribution of concentrations of lithium ions around the negative electrode has a tendency opposite to that shown in FIG. 5. That is, the lithium ion concentration on the interface between the negative electrode and the electrolyte is higher, by what corresponds to the current flowing in the battery, than the average value of the lithium ion concentration in the electrolyte solution. Lithium ions diffuse from the interface with a high concentration to the electrolyte solution with a low concentration, the distribution of concentrations of lithium ions is gradually enlarged as the time elapses, and the thickness of the diffusion layer increases accordingly.

The distributions of concentrations of lithium ions around the positive electrode and the negative electrode during discharging have thus been described. During charging, the distributions of concentrations of lithium ions at the positive electrode and the negative electrode have opposite tendencies. Diffusion layers with concentration gradients opposite to those during discharging occur around the positive electrode and the negative electrode. Accordingly, the upper limit current calculator 152 is required to calculate the upper limit current separately between the charging side and discharging side.

Figure 6:
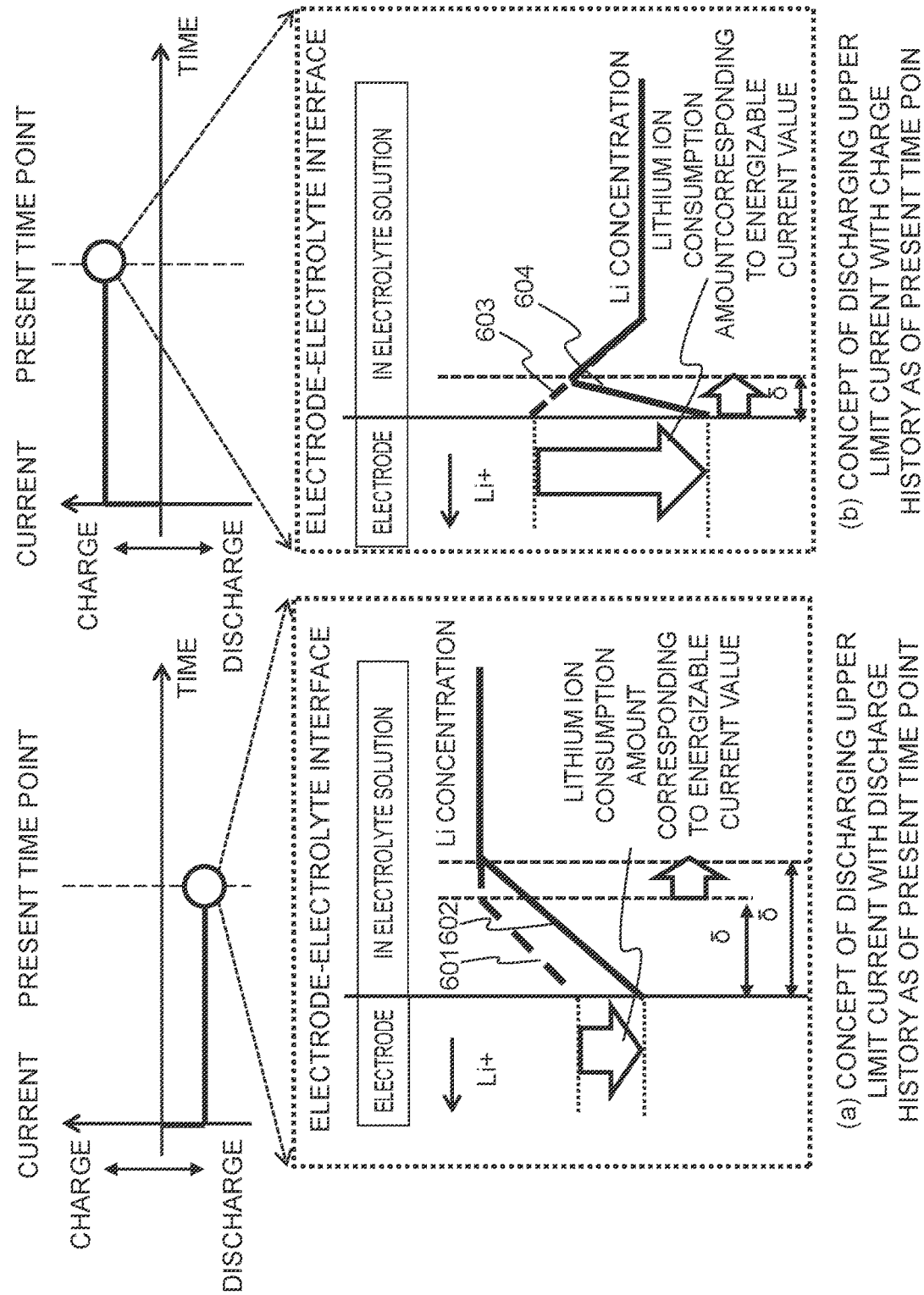
FIG. 6 shows an overview of a discharging upper limit current after charge/discharge continuation.

FIG. 6 shows an overview of a discharging upper limit current after charge/discharge continuation. FIG. 6(a) shows a concept of the discharging upper limit current in a case with a discharge history as of the present time point, that is, in a case where discharging continues until a time immediately before the present time. In the case with the discharge history as of the present time point, a concentration gradient where the concentration of lithium ions gradually decreases from the electrolyte toward the interface occurs around the interface between the electrode (positive electrode) and the electrolyte as of the present time point, as indicated by a broken line 601 in FIG. 6(a). At a time point after lapse of any time period of continuation of discharge in this state, the diffusion layer is enlarged more than that at the present time point. Accordingly, the lithium ion concentration gradient changes from the broken line 601 to a solid line 602. Accordingly, it is conceivable that the discharging upper limit current at the present time point is determined according to the difference between concentrations of lithium ions remaining on the interface indicated by the broken line 601 and the solid line 602.

FIG. 6(b) shows a concept of the discharging upper limit current in a case with a charge history as of the present time point, that is, in a case where charging continues until a time immediately before the present time. In the case with the charge history as of the present time point, a concentration gradient where the concentration of lithium ions gradually increases from the electrolyte toward the interface occurs around the interface between the electrode (positive electrode) and the electrolyte as of the present time point, as indicated by a broken line 603 in FIG. 6(b). At a time point after lapse of any time period in the case where discharge is started in this state, the concentration gradient changes in the opposite direction according to the thickness of the diffusion layer. Accordingly, the lithium ion concentration gradient changes from the broken line 603 to a solid line 604. Accordingly, it is conceivable that the discharging upper limit current at the present time point is determined according to the difference between concentrations of lithium ions remaining on the interface indicated by the broken line 603 and the solid line 604.

As understood with reference to FIG. 6, the case with the discharge history is in a state where the lithium ion concentration on the interface between the electrode and the electrolyte is low, and the diffusion layer is enlarged, in comparison with the case with no discharge history. Accordingly, the discharging upper limit current in this case is lower than that in the case with no discharge history. On the other hand, the case with the charge history is in a state where the lithium ion concentration on the interface between the electrode and the electrolyte is high, and no diffusion layer affecting the discharging upper limit current occurs, in comparison with the case with no charge history. Accordingly, the discharging upper limit current in this case is higher than that in the case with no charge history.

Note that the discharging upper limit current after charge/discharge continuation has thus been described above. An identical or similar concept can be adopted for the charging upper limit current after charge/discharge continuation by replacing charging and discharging with each other. That is, the case with the discharge history has a higher charging upper limit current than the case with no discharge history. On the other hand, the case with the charge history has a lower charging upper limit current than the case with no discharge history.

Here, an upper limit current estimation model expression is described. The upper limit current estimation model expression can be configured on the basis of the Cottrell equation, which is shown as the following Expression (1), for example.

[Expression 1]

$$I_{limit}(t, T) = -nFAD(T)\frac{C^*}{\delta(t, T)} \quad (1)$$

In Expression (1), t represents the battery energization time period [sec], and T represents the temperature [° C.] of the battery. Furthermore, n represents the number of moles [mol] of the electrons, F represents the Faraday constant [C/mol], A represents the area of the electrode [cm^2], D(T) represents the diffusion constant [cm^2/sec] at the temperature T, C* represents the lithium ion concentration [mol/cm^3] at an offshore position sufficiently apart from the interface between the electrode and the electrolyte, and δ represents the thickness [cm] of the diffusion layer.

Note that the thickness δ of the diffusion layer in Expression (1) is given by the following Expression (2).

[Expression 2]

$$\delta(t,T) = \sqrt{\pi D(T)t} \quad (2)$$

Expression (1) represents the behavior of the upper limit current only in a case where charge or discharge is started in a state with the battery being in a stable state, that is, in a case where the lithium ion concentration on the interface between the electrode and the electrolyte at t=0 is equal to C*. Accordingly, in order to reproduce the behavior as shown in FIG. 6, it is required to estimate the lithium ion concentration on the interface and the diffusion layer according to the charge and discharge histories until the present time point. Here, for example, the relational expression derived from the diffusion equation represented in the following Expression (3) can be applied to the lithium ion concentration on the interface.

[Expression 3]

$$\frac{\partial C(x, t)}{\partial t} = D(T)\frac{\partial^2 C(x, t)}{\partial x^2} \quad (3)$$

Expression (3) is solved to obtain the following Expression (4), for example.

[Expression 4]

$$C(0, t) = C^* + \frac{1}{nFA\sqrt{\pi D(T)}}\int_0^t \frac{I(\tau)}{\sqrt{t-\tau}}dx \quad (4)$$

What is obtained by replacing the lithium ion concentration on the interface obtained by Expression (4) with C* in Expression (1) described above can be utilized as an upper limit current estimation model expression in consideration of the distribution of concentrations of lithium ions in the diffusion layer according to the charge and discharge histories until the present time point.

Figure 7:
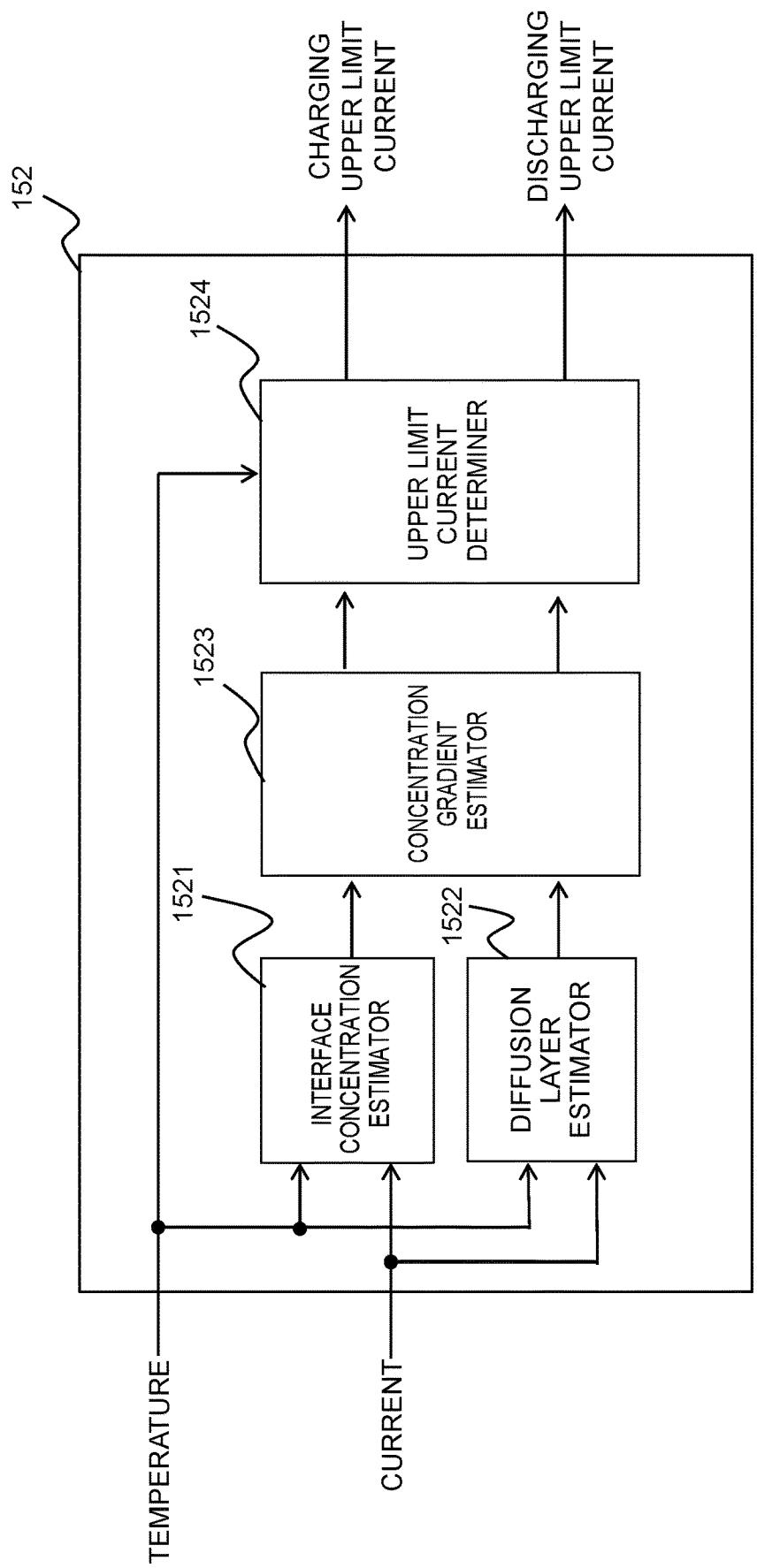
FIG. 7 is a control block diagram of an upper limit current calculator according to the first embodiment of the present invention.

FIG. 7 is a control block diagram of the upper limit current calculator 152 according to the first embodiment of the present invention based on the upper limit current estimation model expression described above. In this embodiment, the upper limit current calculator 152 includes an interface concentration estimator 1521, a diffusion layer estimator 1522, a concentration gradient estimator 1523, and an upper limit current determiner 1524.

The interface concentration estimator 1521 estimates the lithium ion concentration on the interface between the electrode and the electrolyte. Here, based on the current and temperature of each of batteries input from the current detector 130 and the unit battery manager 120 into the upper limit current calculator 152, the lithium ion concentration on the interface during charging or discharging is calculated by the Expression (4) described above, for example, and is output. Note that provided that the value of the diffusion constant D(T) is assumed to be constant in Expression (4) irrespective of the temperature T, the lithium ion concentration on the interface can be calculated by the interface concentration estimator 1521 on the basis only of the current of each battery.

The diffusion layer estimator 1522 estimates the thickness of the diffusion layer formed around the interface. Here, based on the current and temperature of each of batteries input from the current detector 130 and the unit battery manager 120 into the upper limit current calculator 152, the thickness of the diffusion layer during charging or discharging is calculated by the Expression (2) described above, for example, and is output. Provided that the value of the diffusion constant D(T) is assumed to be constant irrespective of the temperature T in Expression (2), the thickness of the diffusion layer can be calculated on the basis only of the current of each battery, also by the diffusion layer estimator 1522, similar to the interface concentration estimator 1521.

The concentration gradient estimator 1523 estimates the lithium ion concentration gradient in the diffusion layer on the basis of the lithium ion concentration on the interface output from the interface concentration estimator 1521 and of the thickness of the diffusion layer output from the diffusion layer estimator 1522. Here, for example, by dividing the calculation result of the interface concentration estimator 1521 by the calculation result of the diffusion layer estimator 1522, the lithium ion concentration gradient in the diffusion layer is calculated and output. Accordingly, the concentration gradient estimator 1523 can estimate the ion concentration gradient in the diffusion layer formed during charging or discharging, on the basis of the current and temperature of each battery. In the case where the calculations in the interface concentration estimator 1521 and the diffusion layer estimator 1522 are performed on the basis only of the current of each battery as described above, the ion concentration gradient in the diffusion layer formed during charging or discharging is estimated by the concentration gradient estimator 1523 on the basis only of the current of each battery.

The upper limit current determiner 1524 determines the charging upper limit current and the discharging upper limit current of each battery on the basis of the lithium ion concentration gradient estimated by the concentration gradient estimator 1523. Here, the charging upper limit current and the discharging upper limit current are calculated such that the overvoltage of the battery according to the lithium ion concentration gradient falls within a predetermined range, for example, according to the Expression (1), on the basis of the temperature of each battery input from the unit battery manager 120 into the upper limit current calculator 152 and of the calculation result of the concentration gradient estimator 1523, and are output. At this time, the lithium ion concentration gradient in the diffusion layer estimated by the concentration gradient estimator 1523 may be used for C*/δ(t, T), which is on the right-hand side of Expression (1).

Next, the upper limit current determiner 1524 is described in detail with reference to FIGS. 8 and 9. In this embodiment, the upper limit current determiner 1524 is implemented as, for example, a map of the upper limit current according to the lithium ion concentration gradient estimated by the concentration gradient estimator 1523 and the temperature of the battery. The method of collecting the map data is described below with reference to FIG. 8.

Figure 8:
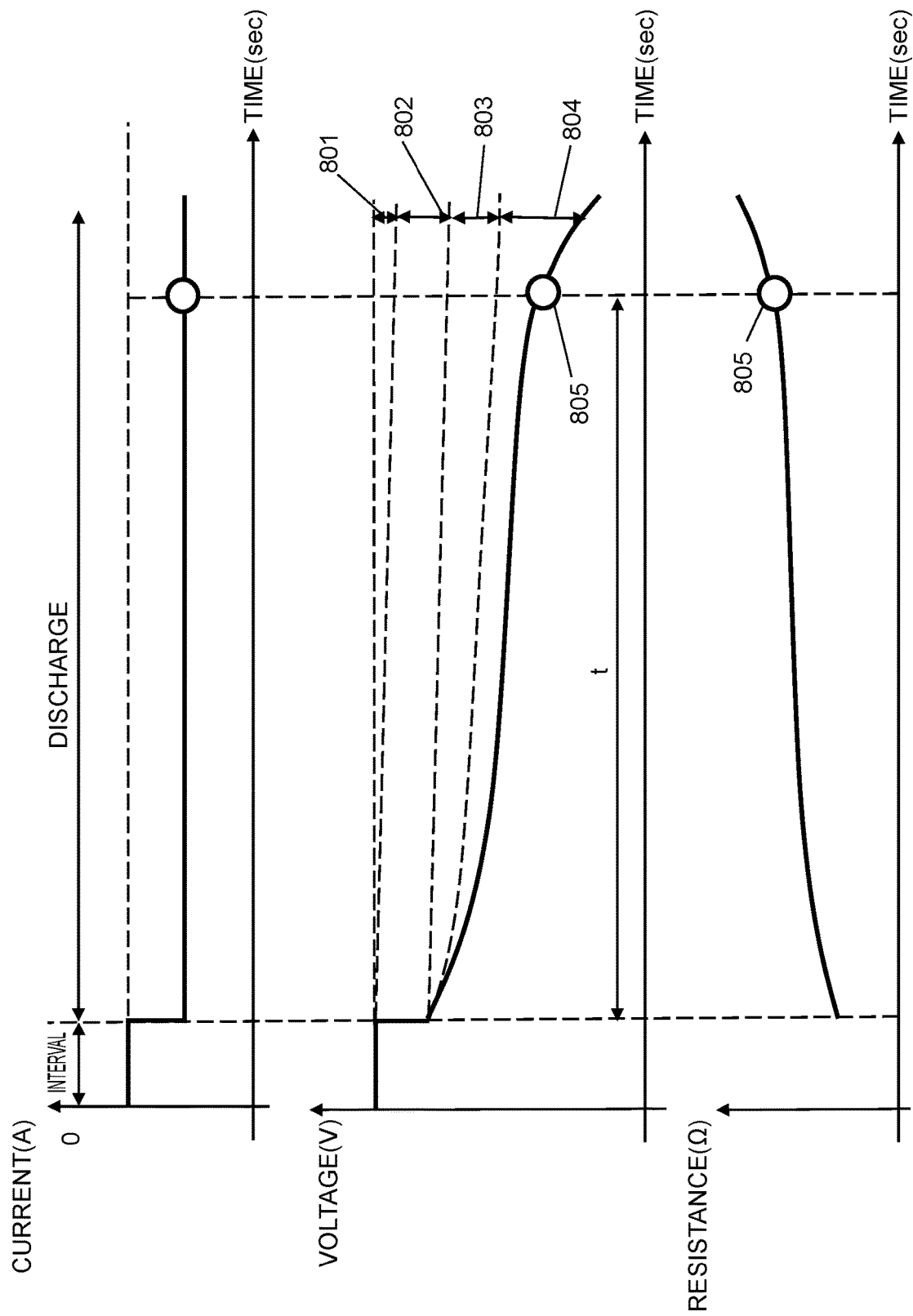
FIG. 8 illustrates an overvoltage component of a battery.

FIG. 8 illustrates an overvoltage component of a battery. FIG. 8 is an example of a graph showing the behavior of the voltage and resistance during continuous discharge of the battery with a certain current. As shown in FIG. 8, as the time elapses after start of discharging, the voltage decreases and the resistance increases. The change in voltage in this case is conceivable separately with respect to individual voltage components respectively indicated by reference signs 801 to 804 according to the differences of the causes.

The voltage component 801 indicates the change of OCV according to change in SOC, and gradually increases according to the lapse of time. The voltage component 802 indicates a voltage component corresponding to an ohmic resistance component due to members or the like in the battery, and is constant irrespective of the lapse of time. The voltage component 803 indicates a voltage component (activation overvoltage) corresponding to the resistance component according to the electrochemical reaction in the battery, largely changes at the start of discharging, and gradually increases as the time elapses thereafter. The voltage component 804 indicates the voltage component (diffusion overvoltage) corresponding to the resistance component due to the lithium ion concentration gradient in the diffusion layer as described above, and steeply increases after lapse of a certain energization time period after the start of discharging. At this time, diffusion of lithium ions in the diffusion layer around the interface between the electrode and the electrolyte limits the speed in the battery as described above, and the resistance rises, which steeply reduces the battery voltage.

As the resistance component of the battery increases, the output performance decreases accordingly. There is a possibility that steep reduction in output performance affects the travel of the vehicle. Accordingly, it is preferable to limit the current flowing in the battery so as to suppress increase in resistance component due to the diffusion as described above. In this embodiment, for each of the charging side and discharging side, the continuous energization time period from start of charge/discharge of the battery to steep increase in resistance value is measured with respect to individual temperatures of the battery. The time period measured in this test corresponds to a time period in which the rate of the resistance component according to the lithium ion concentration gradient in the internal resistance of the battery exceeds a predetermined range. Based on an obtained test result, the relationship between the lithium ion concentration gradient in the diffusion layer and the upper limit current is extracted. Data obtained by mapping the relationship on a temperature-by-temperature basis is preliminarily stored in the storage 180. Accordingly, in the upper limit current determiner 1524, the charging upper limit current and the discharging upper limit current that allow the rate of the resistance component according to the lithium ion concentration gradient in the internal resistance of the battery to fall within the predetermined range can be obtained by map search, from the temperature and the lithium ion concentration gradient of the battery.

Specifically, for example, in a case where the current of the battery has a certain value, the continuous energization time period before a time when the resistance value due to lithium ion diffusion becomes large is preliminarily measured. The lithium ion concentration on the interface between the electrode and the electrolyte and the thickness of the diffusion layer at this time are obtained from Expressions (2) and (3) described above. The relationship between the rate (concentration gradient) and the current value is extracted as the relationship between the lithium ion concentration gradient in the diffusion layer and the upper limit current. Such a test is performed with the current and temperature of the battery being changed, which can construct the upper limit current map for use for the map search in the upper limit current determiner 1524.

Figure 9:
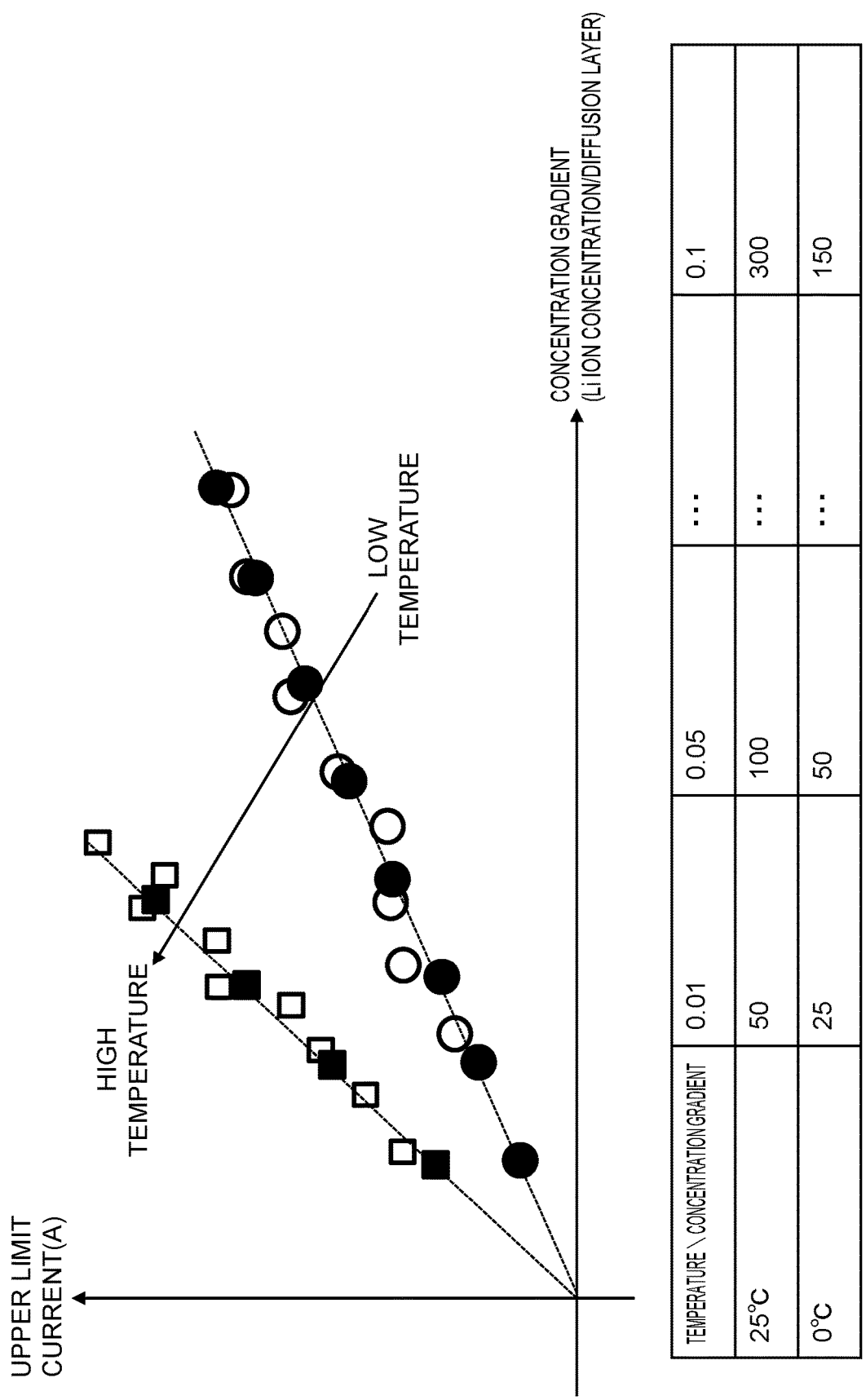
FIG. 9 shows an example of an upper limit current map according to the first embodiment of the present invention.

FIG. 9 shows an example of the upper limit current map according to the first embodiment of the present invention. The graph shown in an upper diagram of FIG. 9 represents the relationship between the lithium ion concentration gradient in the diffusion layer and the upper limit current. The abscissa axis represents the ratio between the lithium ion concentration and the thickness of the diffusion layer (concentration gradient). The ordinate axis represents the upper limit current. In this diagram, points indicated by circles and squires represent actually measured values. The types of these points represent differences of temperatures. This graph shows that even with the same concentration gradient, the higher the temperature of the battery is, the higher the upper limit current is.

Meanwhile, a table shown in a lower part of FIG. 9 is an example of an upper limit current map constructed from the graph in the upper diagram. In this table, the temperature and the concentration gradient are adopted as axes, and with respect to each combination of these values, the upper limit current value is set. Such an upper limit current map can be obtained by creating an approximate curve on a temperature-by-temperature basis from the graph in the upper diagram.

The upper limit current map illustrated in FIG. 9 is stored in the storage 180, for example, and is referred to by the upper limit current determiner 1524. Note that in FIG. 9, the approximate curves are approximated by straight lines. However, they do not necessarily form straight lines in certain cases. Accordingly, approximate curves that can favorably approximate test results may be obtained to create the upper limit current map.

As for the assembled battery controller 150, in the upper limit current calculator 152, according to the calculation method as described above, the charging upper limit current and the discharging upper limit current can be determined such that the rate of the resistance component according to the lithium ion concentration gradient in the diffusion layer around the interface in the internal resistance of the battery can fall within the predetermined range. Accordingly, the charging upper limit current and the discharging upper limit current can be determined such that the overvoltage of the battery falls within the predetermined range.

Subsequently, a specific method of calculating the chargeable power and the dischargeable power by the chargeable and dischargeable power calculator 153 is described. In the assembled battery controller 150, the chargeable and dischargeable power calculator 153 calculates the chargeable power Wchg(t) and the dischargeable power Wdis(t) of each battery respectively according to the following Expressions (5) and (6), on the basis of the charging upper limit current and the discharging upper limit current determined by the upper limit current calculator 152, of SOC and SOHR of each battery calculated by the battery state detector 151, and of the temperature of each battery detected by the temperature detector 125 in the unit battery controllers 121, and outputs the powers.

[Expression 5]

$$W_{chg}(t) = N \times I_{limut,chg}(t, T) \times \left( OCV(SOC, T) + I_{limut,chg}(t, T) \times R_0(SOC, T) \times \frac{SOHR}{100} + V_p(t) \right) \quad (5)$$

$$W_{dis}(t) = N \times I_{limut,dis}(t, T) \times \left( OCV(SOC, T) - I_{limut,dis}(t, T) \times R_0(SOC, T) \times \frac{SOHR}{100} + V_p(t) \right) \quad (6)$$

In Expressions (5) and (6), N indicates the number of cells of the battery, Ro indicates the ohmic resistance [Ω] due to members and the like of the battery, and Vp indicates the polarizing voltage [V]. Note that parenthesized parts in right-hand sides of Expressions (5) and (6), that is, parts of OCV (SOC, T) and thereafter, correspond to respective expressions of estimating the battery voltage during upper limit current energization. These expressions of estimating battery voltages can be derived from an equivalent circuit model of the battery. However, the equivalent circuit model is an already publicly known technology. Accordingly, detailed description thereof is omitted in this embodiment.

Figure 10:
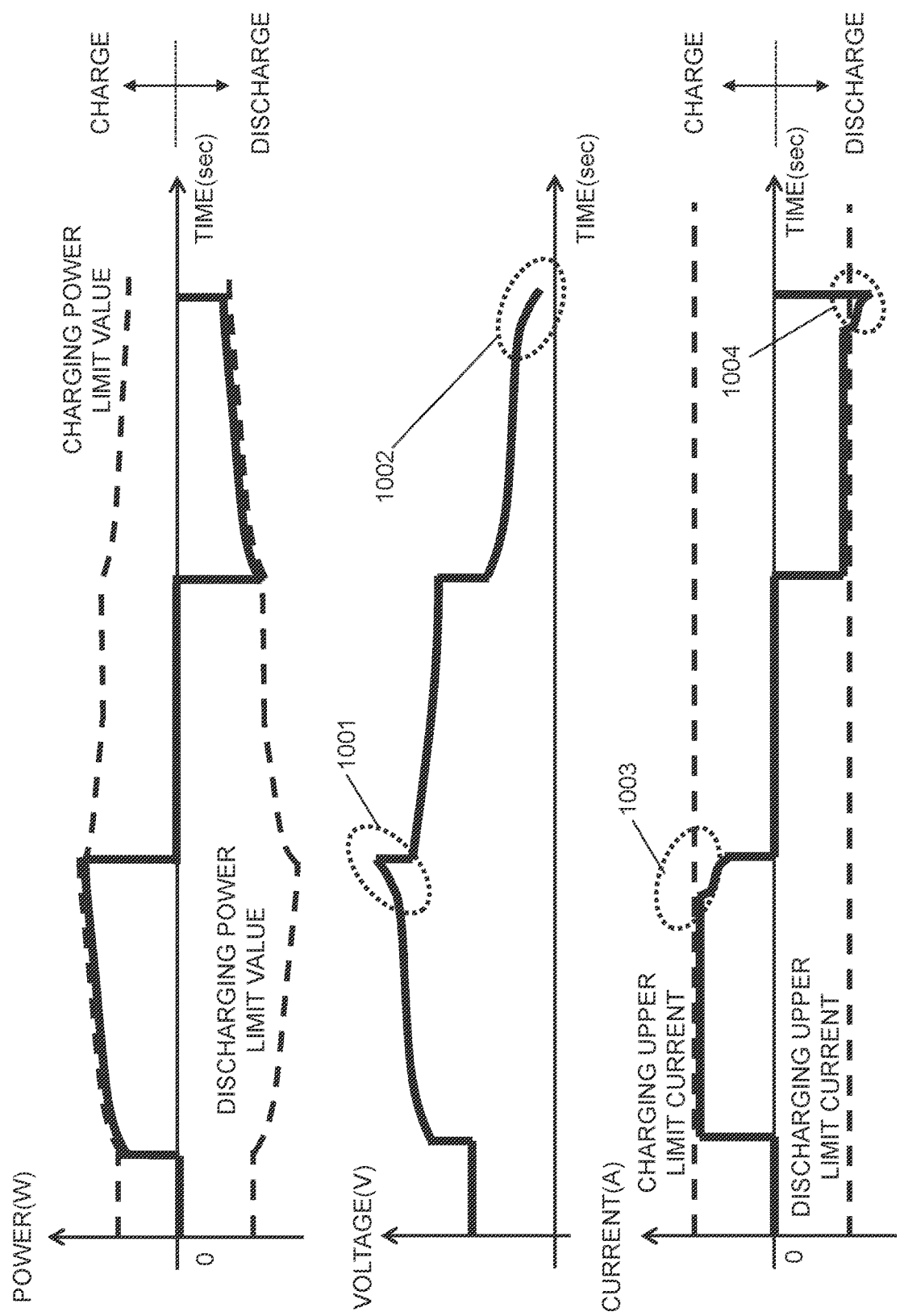
FIG. 10 shows an example of change in power, voltage and current of the battery due to the upper limit current in a case where the first embodiment of the present invention is not applied.

Next, advantageous effects of this embodiment are described with reference to FIGS. 10 and 11. FIG. 10 shows an example of change in power, voltage and current of the battery due to the upper limit current in a case where the first embodiment of the present invention is not applied. FIG. 10 shows waveform examples of the power, voltage and current in a case where the upper limit current setting method as described in this embodiment is not applied, the charging upper limit current and the discharging upper limit current are set to certain values, the battery is continuously charged with the charging upper limit current, and after lapse of a certain time period, the battery is continuously discharged with the discharging upper limit current.

As shown in FIG. 10, in the case where the method in this embodiment is not applied and the charging upper limit current and the discharging upper limit current are set to the certain values, the voltage is increased by increase in resistance due to the lithium ion concentration gradient in the diffusion layer as indicated by a reference sign 1001 when a certain time period elapses after start of charging, at the first continuous charging. As a result, as indicated by reference sign 1003, the current value decreases by the amount of increase in voltage. Likewise, also in a case of discharging after charging, as indicated by reference sign 1002, the voltage is reduced by increase in resistance due to the lithium ion concentration gradient in the diffusion layer when a certain time period elapses after start of discharging. As a result, as indicated by reference sign 1004, the current increases by the amount of reduction in voltage, and exceeds the upper limit current. In such a case, on the charging side, the power chargeable in the battery decreases. There is a concern that at worst, charging cannot be made although SOC is low. On the contrary, on the discharging side, a high current flows. Accordingly, there is a concern that heat generation and deterioration of the battery accelerate, and the performance of the battery cannot be utilized to the maximum.

Figure 11:
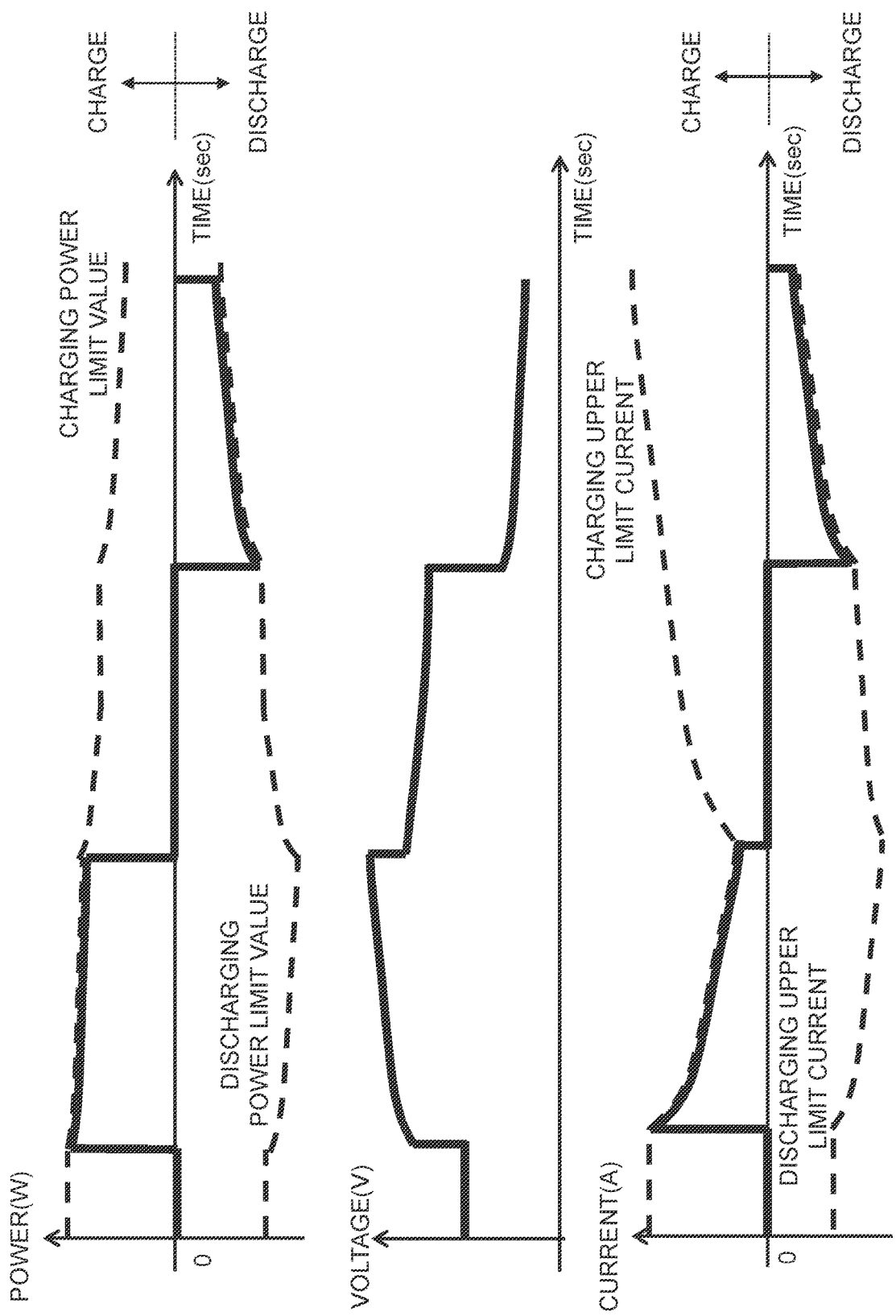
FIG. 11 shows an example of change in power, voltage and current of the battery due to the upper limit current in a case where the first embodiment of the present invention is applied.

FIG. 11 shows an example of change in power, voltage and current of the battery due to the upper limit current in the case where the first embodiment of the present invention is applied. FIG. 11 shows waveform examples of the power, voltage and current in a case where the charging upper limit current and the discharging upper limit current are set in consideration of the lithium ion concentration gradient in the diffusion layer according to the upper limit current setting method in this embodiment as described above, and the battery is continuously charged with the charging upper limit current, and after lapse of a certain time period, the battery is continuously discharged with the discharging upper limit current.

As shown in FIG. 11, in the case where the charging upper limit current and the discharging upper limit current are set by applying the method of this embodiment, the battery is charged and discharged with the power based on the result of real-time estimation of the upper limit current value that can suppress increase in resistance due to the lithium ion concentration gradient in the diffusion layer. Accordingly, on each of the charging and discharging sides, the battery can be charged and discharged while suppressing steep change in voltage due to increase in diffusion resistance. As a result, increase in voltage during charging and reduction in voltage during discharging as in FIG. 10 do not occur. Resultantly, the charging performance can be prevented from decreasing, heat generation and deterioration during discharging can be suppressed, and the performance of the battery can be utilized to the maximum.

As described above, according to the first embodiment of the present invention, the input and output performance of the battery can be utilized to the maximum, while avoiding the region where the voltage of the secondary battery steeply changes.

The first embodiment of the present invention described above exerts the following working effects.

(1) The upper limit current calculator 152 in the assembled battery controller 150 includes: a concentration gradient estimator 1523 that estimates a lithium ion concentration gradient in a diffusion layer formed around an interface between an electrode and an electrolyte of a battery, based on a current flowing in the unit battery 111 or the assembled battery 110, which is a secondary battery, or on the current and the temperature of the battery; and an upper limit current determiner 1524 that determines an upper limit current value of the battery, based on the lithium ion concentration gradient. The upper limit current determiner 1524 determines the upper limit current value such that an overvoltage of the battery according to the lithium ion concentration gradient falls within a predetermined range. According to such a configuration, an appropriate upper limit current value can be set in consideration of steep change in battery voltage in the high-current region caused by the lithium ion concentration gradient in the diffusion layer formed around the interface between each electrode and the electrolyte.

(2) The upper limit current determiner 1524 determines the upper limit current value such that the rate of the resistance component according to the lithium ion concentration gradient in the internal resistance of the battery falls within a predetermined range. According to such a configuration, the upper limit current value allowing the overvoltage of the battery to fall within the predetermined range can be securely determined.

(3) The upper limit current calculator 152 in the assembled battery controller 150 includes: the interface concentration estimator 1521 that estimates the lithium ion concentration on the interface between the electrode and the electrolyte of the battery; and the diffusion layer estimator 1522 that estimates the thickness of the diffusion layer. The concentration gradient estimator 1523 estimates the lithium ion concentration gradient on the basis of the lithium ion concentration in the interface estimated by the interface concentration estimator 1521 and of the thickness of the diffusion layer estimated by the diffusion layer estimator 1522. According to such a configuration, the lithium ion concentration gradient in the diffusion layer formed around the interface between the electrode and the electrolyte of the battery can be securely estimated.

(4) The assembled battery controller 150 includes the chargeable and dischargeable power calculator 153 that estimates the voltage of the battery during upper limit current energization, based on the upper limit current value determined by the upper limit current determiner 1524 in the upper limit current calculator 152, and estimates the chargeable power and the dischargeable power of the battery, based on the estimated voltage and upper limit current value. According to such a configuration, the chargeable power and the dischargeable power during upper limit current energization can be estimated in real time.

Note that in the first embodiment of the present invention described above, the example has been described that controls the overvoltage of the battery to fall within the predetermined range by the upper limit current determiner 1524 determining the charging upper limit current value and the discharging upper limit current value such that the rate of the resistance component according to the lithium ion concentration gradient in the diffusion layer in the internal resistance of each battery to fall in the predetermined range, on the basis of the temperature and lithium ion concentration gradient of each battery. Alternatively, the upper limit current value may be determined by another method. For example, the overvoltage of the battery can be controlled to fall within the predetermined range, by determining the charging upper limit current value and the discharging upper limit current value so as to maximize the charging and discharging powers of the battery to the maximum. Note that as shown in FIG. 8, the longer the energization time period after start of charging or discharging is, the higher the resistance of the battery is. In consideration of this point, the charging upper limit current value and the discharging upper limit current value may be reduced according to the lapse of the energization time period of the battery. Also by such a method, advantageous effects identical or similar to those described in the first embodiment can be exerted.

Second Embodiment

Next, a second embodiment of the present invention is described. In this embodiment, an example of determining the upper limit current value in consideration of battery deterioration is described. Note that the configuration of the battery system according to this embodiment is identical or similar to that of the battery system 100 in FIG. 1 illustrated in the first embodiment except that the configuration includes an assembled battery controller 150a instead of the assembled battery controller 150. Hereinafter, the details of this embodiment are described mainly on the difference between the assembled battery controllers 150 and 150a.

Figure 12:
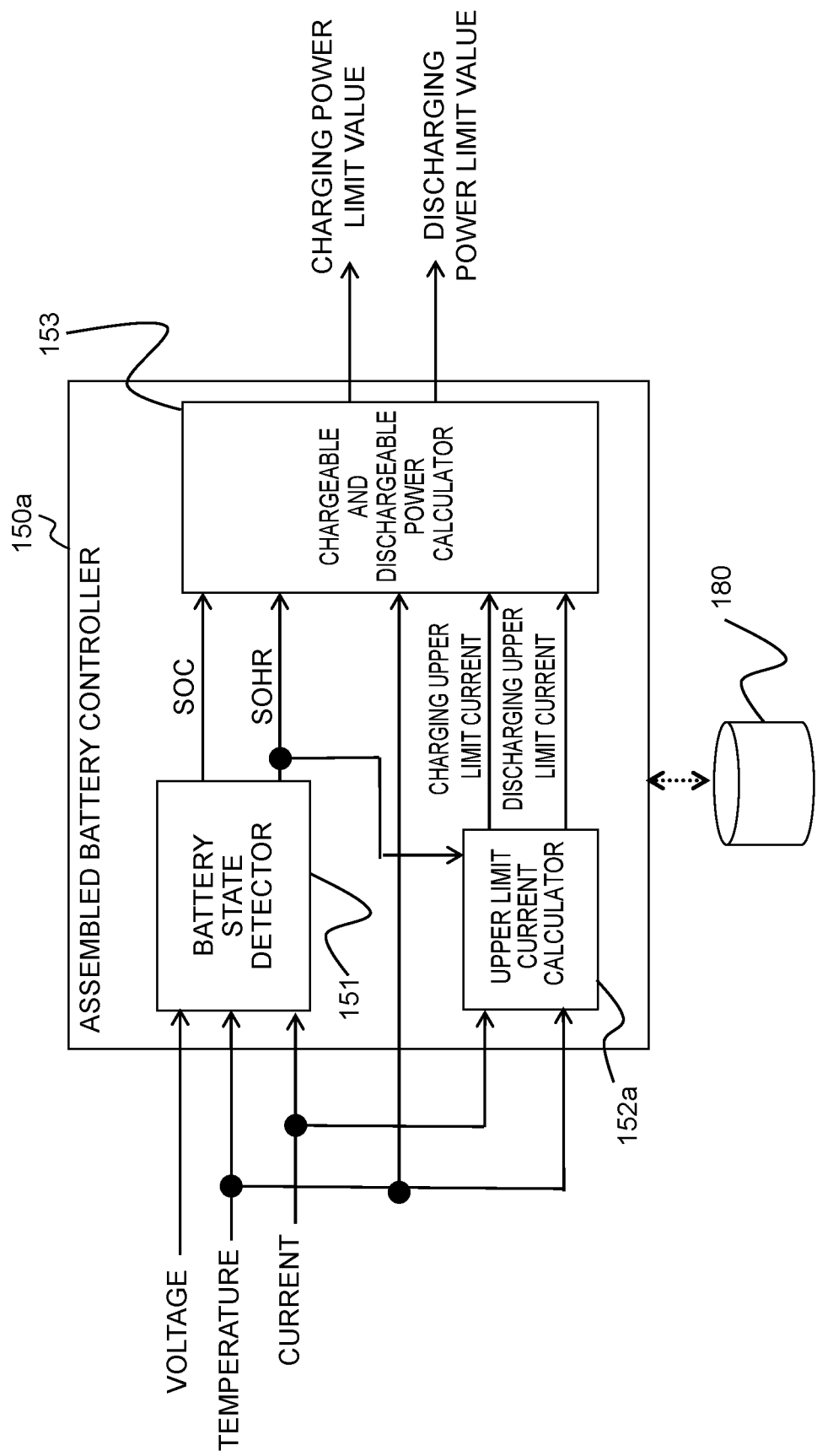
FIG. 12 shows a functional configuration of an assembled battery controller according to a second embodiment of the present invention.

FIG. 12 shows the functional configuration of the assembled battery controller 150a according to the second embodiment of the present invention. The assembled battery controller 150a in this embodiment has a functional configuration identical or similar to that of the assembled battery controller 150 in the first embodiment except that an upper limit current calculator 152a is included instead of the upper limit current calculator 152 in FIG. 3, and SOHR of each battery calculated by the battery state detector 151 is input into the upper limit current calculator 152a.

Similar to the upper limit current calculator 152 in the first embodiment, the upper limit current calculator 152a calculates the charging upper limit current and the discharging upper limit current of each battery on the basis of the current and temperature of the corresponding battery, and outputs the calculated currents. At this time, the upper limit current calculator 152a executes calculation of the upper limit current value according to SOHR of each battery calculated by the battery state detector 151, thereby changing the charging upper limit current and the discharging upper limit current on the basis of the deterioration state of the corresponding battery.

Figure 13:
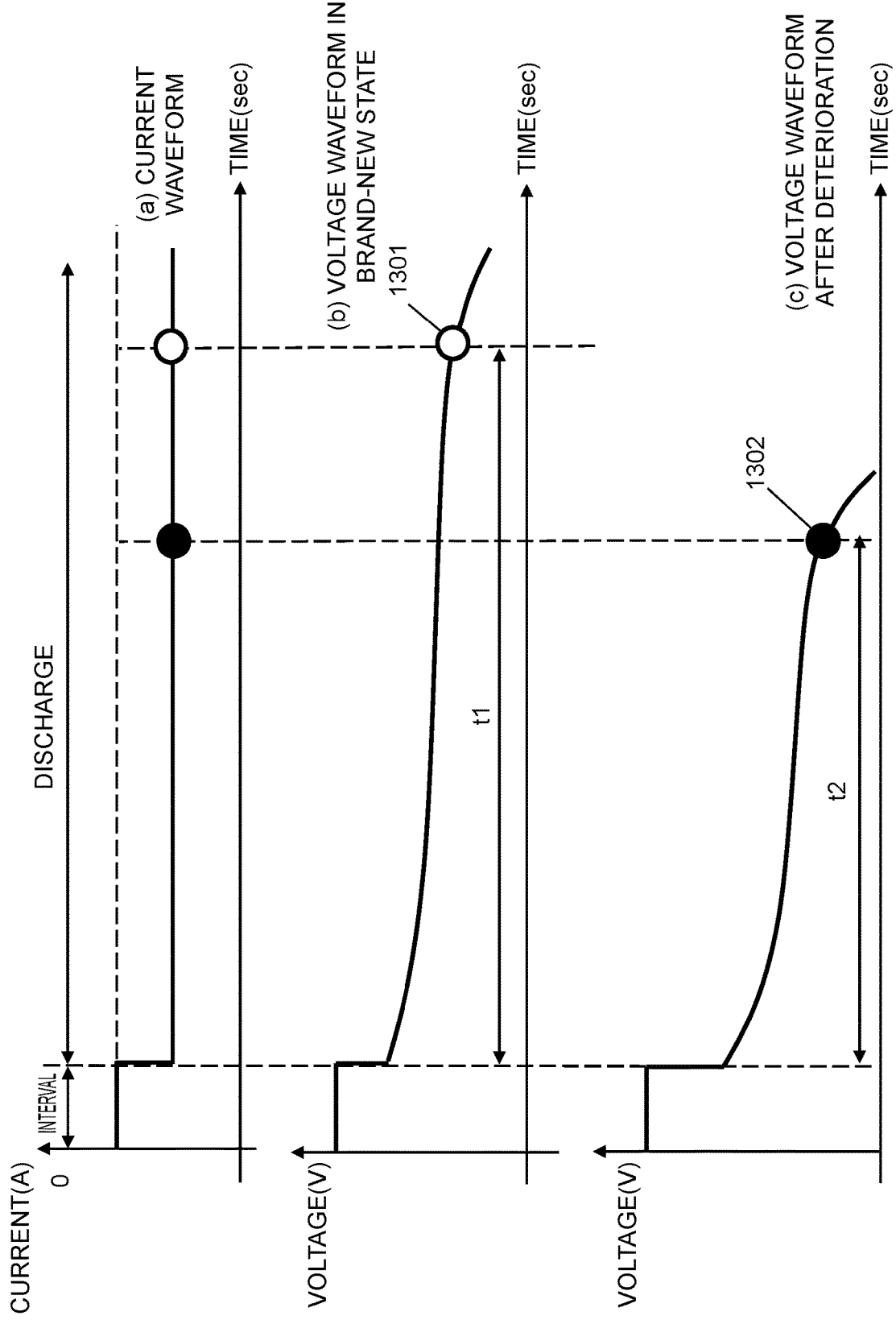
FIG. 13 illustrates change in voltage waveform due to battery deterioration.

Hereinafter, referring to FIGS. 13 and 14, change in upper limit current value due to battery deterioration is described. FIG. 13 illustrates the change in voltage waveform due to battery deterioration. When the battery is continuously discharged with a current waveform shown in, for example, FIG. 13(a) in a brand-new state without battery deterioration, the voltage of the battery changes as shown in FIG. 13(b). In this voltage waveform, the resistance component due to the lithium ion concentration gradient in the diffusion layer steeply increases at and after the timing indicated by reference sign 1301 after lapse of a time period t1 from start of discharging, and the battery voltage steeply decreases accordingly, as described in the first embodiment.

On the other hand, for example, when the battery is continuously discharged with the current waveform shown in FIG. 13(a) in a state with battery deterioration, the voltage of the battery changes as shown in FIG. 13(c). In this voltage waveform, the increase in the internal resistance of the battery due to deterioration increases voltage drop during current energization in comparison with the brand-new state. The resistance component due to the lithium ion concentration gradient in the diffusion layer steeply increases at and after the timing indicated by reference sign 1302 after lapse of a time period t2 (t1>t2) from start of discharging, and the battery voltage steeply decreases accordingly. That is, this shows that the increase in resistance component due to lithium ion diffusion occurs in a shorter time period than that in the brand-new state.

Figure 14:
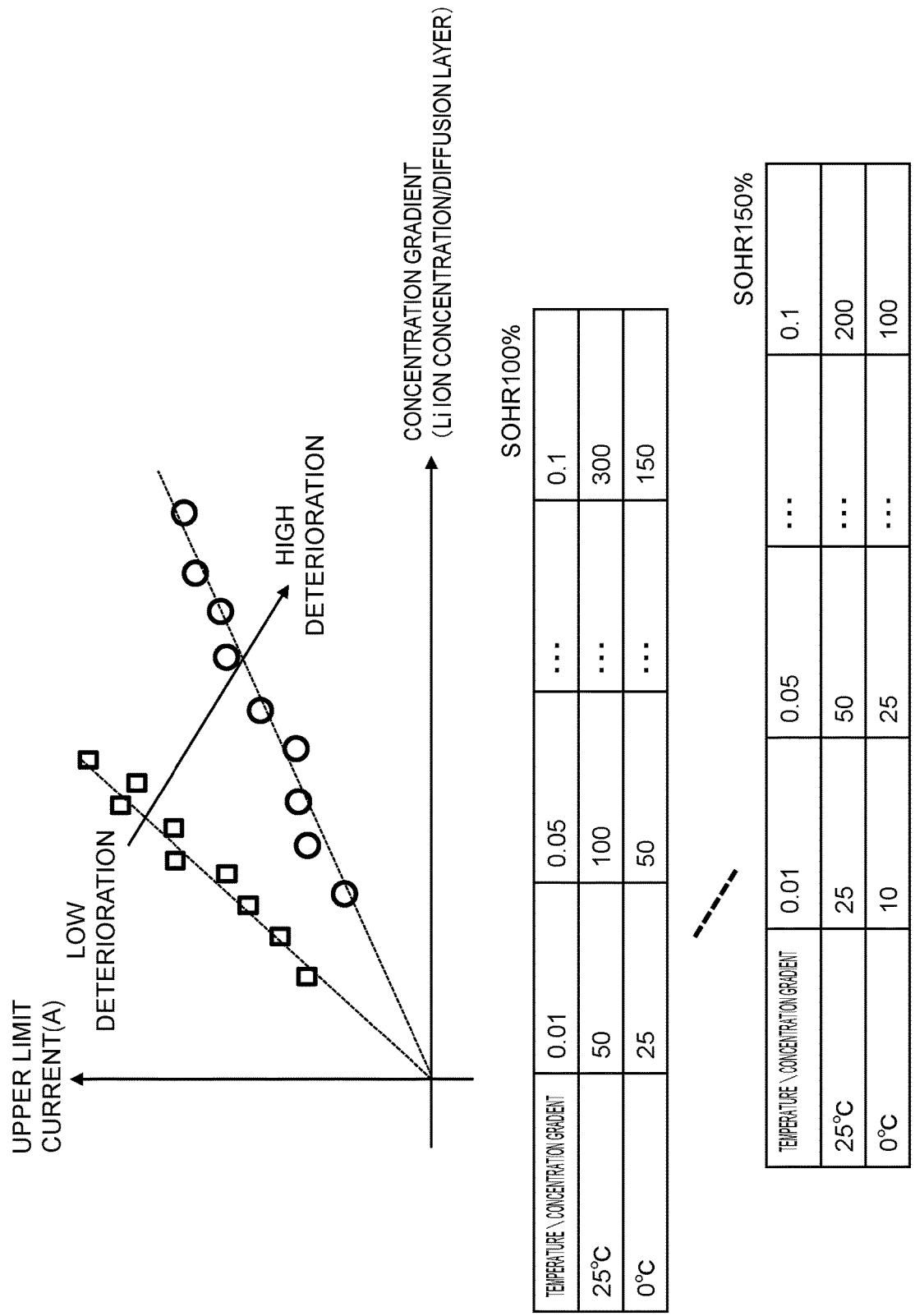
FIG. 14 shows an example of an upper limit current map according to the second embodiment of the present invention.

FIG. 14 shows an example of an upper limit current map according to the second embodiment of the present invention. Similar to FIG. 9, the graph shown in an upper diagram of FIG. 14 represents the relationship between the lithium ion concentration gradient in the diffusion layer and the upper limit current. The abscissa axis represents the ratio between the lithium ion concentration and the thickness of the diffusion layer (concentration gradient). The ordinate axis represents the upper limit current. In this diagram, points indicated by circles and squires represent actually measured values. The types of these points represent differences of battery deterioration states. This graph shows that even with the same concentration gradient, the further the battery deteriorates, the lower the upper limit current is.

Meanwhile, a table shown in a lower part of FIG. 14 is an example of an upper limit current map constructed from the graph in the upper diagram. In this table, multiple upper limit current maps in which the upper limit current value is set with the temperature and the concentration gradient being adopted as axes and which are similar to those described in the first embodiment, are further constructed respectively for the individual deterioration states, that is, SOHR values.

The upper limit current map illustrated in FIG. 14 is stored in the storage 180, for example. Note that in FIG. 14, the approximate curves are approximated by straight lines. Similar to FIG. 9 illustrated in the first embodiment, approximate curves that can favorably approximate test results may be obtained to create the upper limit current map.

Figure 15:
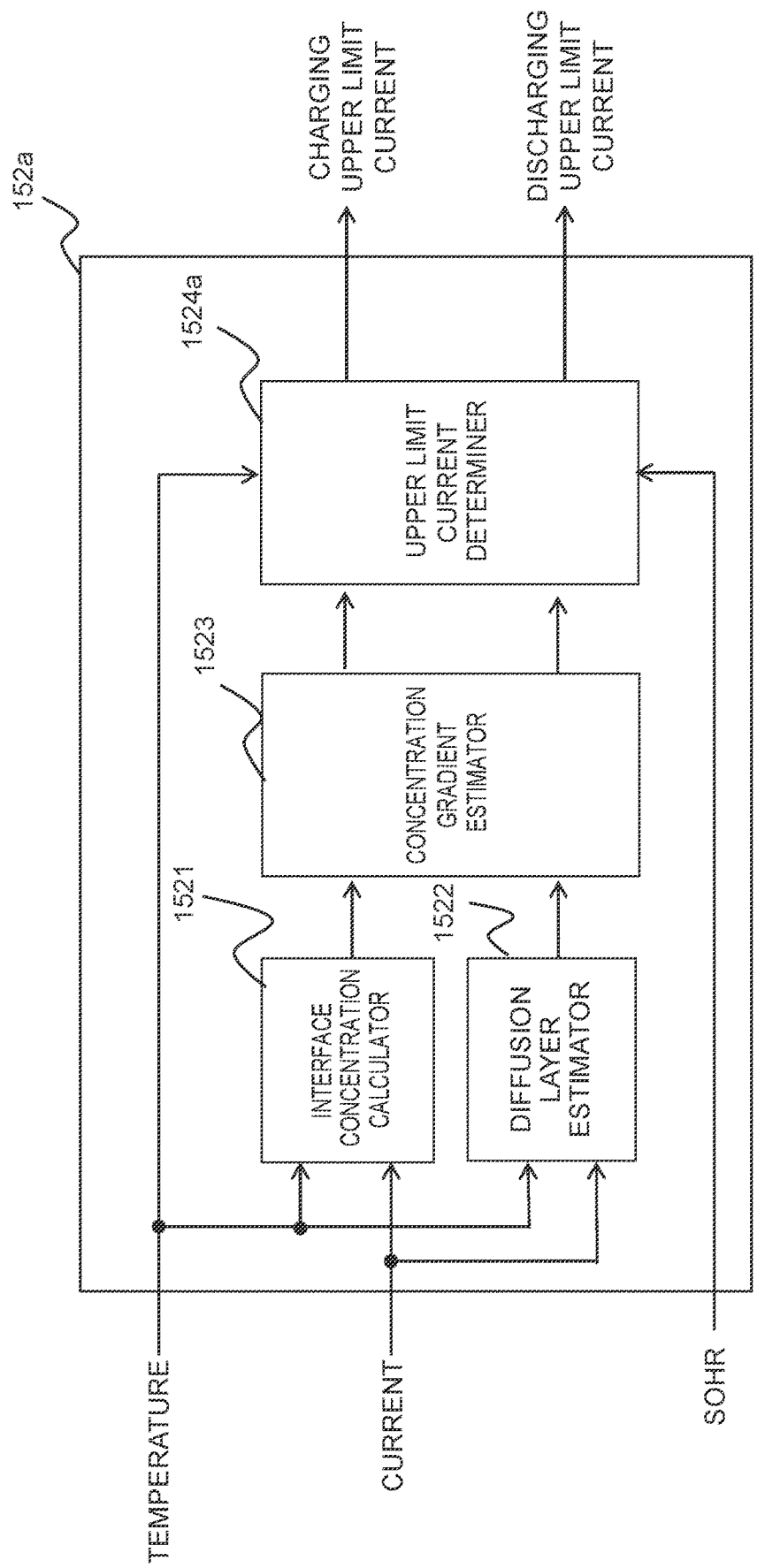
FIG. 15 is a control block diagram of an upper limit current calculator according to the second embodiment of the present invention.

FIG. 15 is the control block diagram of the upper limit current calculator 152a according to the second embodiment of the present invention. The upper limit current calculator 152a in this embodiment includes an upper limit current determiner 1524a instead of the upper limit current determiner 1524 in FIG. 7, and has a functional configuration identical or similar to that of the upper limit current calculator 152 in the first embodiment except that SOHR of each battery calculated by the battery state detector 151 is input into the upper limit current determiner 1524a.

Similar to the upper limit current determiner 1524 in the first embodiment, the upper limit current determiner 1524a determines the charging upper limit current and the discharging upper limit current of each battery on the basis of the lithium ion concentration gradient in the diffusion layer estimated by the concentration gradient estimator 1523. At this time, the upper limit current determiner 1524a calculates the charging upper limit current and the discharging upper limit current, with reference to the upper limit current map as described in FIG. 14, on the basis of the temperature and SOHR of each battery input from the unit battery manager 120 into the upper limit current calculator 152a and of the calculation result of the concentration gradient estimator 1523, and outputs the calculated currents. Accordingly, the charging upper limit current and the discharging upper limit current are determined such that in the current battery deterioration state, the overvoltage of the battery according to the lithium ion concentration gradient in the diffusion layer formed around the interface between the electrode and the electrolyte falls within the predetermined range.

Figure 16:
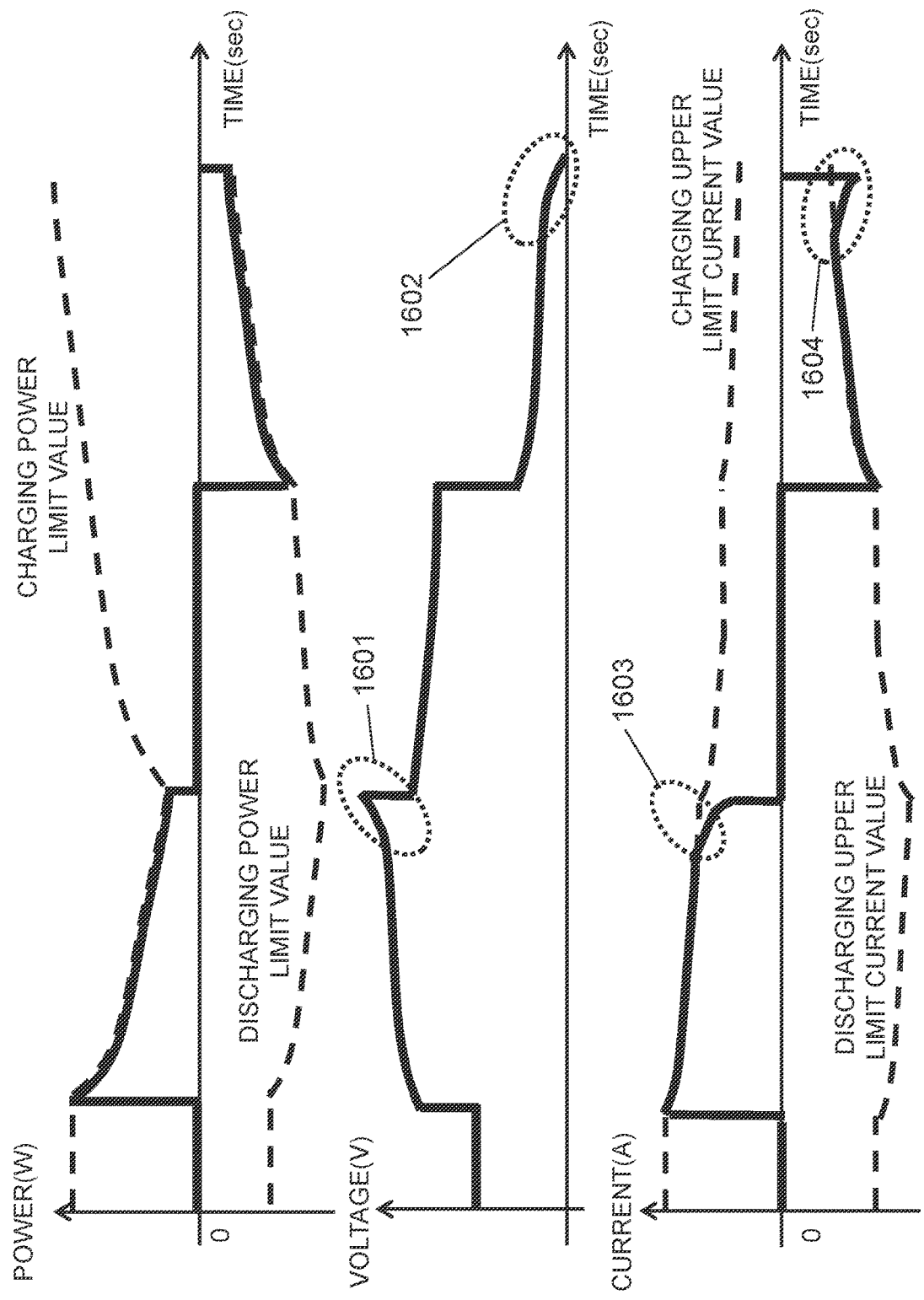
FIG. 16 shows an example of change in power, voltage and current of the battery due to the upper limit current in a case where the second embodiment of the present invention is not applied.

Next, advantageous effects of this embodiment are described with reference to FIGS. 16 and 17. FIG. 16 shows an example of change in power, voltage and current of the battery due to the upper limit current in a case where the second embodiment of the present invention is not applied. FIG. 16 shows waveform examples of the power, voltage and current in a case where the upper limit current setting method as described in this embodiment is not applied, the charging upper limit current and the discharging upper limit current are set with respect to the deteriorating battery according to the method described in the first embodiment, the battery is continuously charged with the charging upper limit current, and after lapse of a certain time period, and the battery is continuously discharged with the discharging upper limit current.

As illustrated in FIG. 13, if the battery deteriorates, a time period from start of battery energization to occurrence of increase in resistance component due to the lithium ion concentration gradient in the diffusion layer is shorter than that in the brand-new state. Accordingly, as shown in FIG. 16, in the case where the charging upper limit current and the discharging upper limit current are set without application of the method in this embodiment, that is, without consideration of the battery deterioration state, the voltage is increased by increase in resistance due to the lithium ion concentration gradient in the diffusion layer as indicated by a reference sign 1601 when a certain time period elapses after start of charging, at the first continuous charging. As a result, as indicated by reference sign 1603, the current value decreases by the amount of increase in voltage. Likewise, also in a case of discharging after charging, as indicated by reference sign 1602, the voltage is reduced by increase in resistance due to the lithium ion concentration gradient in the diffusion layer when a certain time period elapses after start of discharging. As a result, as indicated by reference sign 1604, the current increases by the amount of reduction in voltage, and exceeds the upper limit current. In such a case, similar to the case described in the first embodiment where the charging upper limit current and the discharging upper limit current have the certain values, the power chargeable in the battery decreases on the charging side. There is a concern that at worst, charging cannot be made even though SOC is low. On the contrary, on the discharging side, a high current flows. Accordingly, there is a concern that heat generation and deterioration of the battery accelerate, and the performance of the battery cannot be utilized to the maximum.

Figure 17:
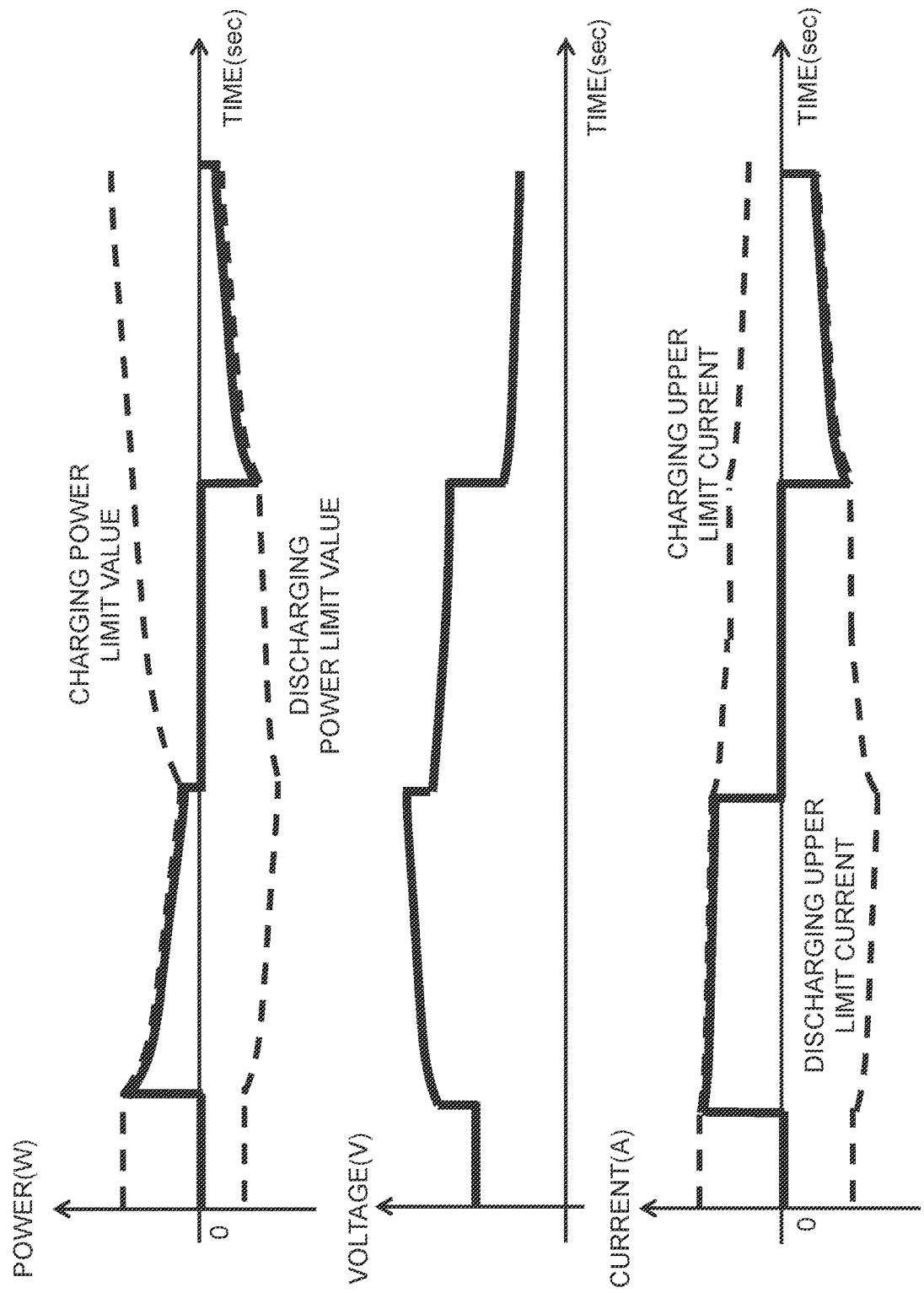
FIG. 17 shows an example of change in power, voltage and current of the battery due to the upper limit current in a case where the second embodiment of the present invention is applied.

FIG. 17 shows an example of change in power, voltage and current of the battery due to the upper limit current in the case where the second embodiment of the present invention is applied. FIG. 17 shows waveform examples of the power, voltage and current in a case where the charging upper limit current and the discharging upper limit current are set in consideration of increase in resistance due to battery deterioration according to the upper limit current setting method according to this embodiment as described above, and the battery is continuously charged with the charging upper limit current, and after lapse of a certain time period, the battery is continuously discharged with the discharging upper limit current.

As shown in FIG. 17, in the case where the charging upper limit current and the discharging upper limit current are set by applying the method of this embodiment, the battery is charged and discharged with the power based on the result of real-time estimation of the upper limit current value that can suppress increase in resistance due to the lithium ion concentration gradient in the diffusion layer; the estimation is made according to the battery deterioration state. Accordingly, on each of the charging and discharging sides, the battery can be charged and discharged while suppressing steep change in voltage due to increase in diffusion resistance. As a result, even if the battery deteriorates, increase in voltage during charging and reduction in voltage during discharging as in FIG. 16 do not occur. Resultantly, the charging performance can be prevented from decreasing, heat generation and deterioration during discharging can be suppressed, and the performance of the battery can be utilized to the maximum.

As described above, according to the second embodiment of the present invention, also in a case where a deteriorating secondary battery is used, the input and output performance of the battery can be utilized to the maximum, while avoiding the region where the voltage of the secondary battery steeply changes.

The second embodiment of the present invention described above further exerts the following working effects, in addition to those described in the first embodiment.

(5) The upper limit current determiner 1524a changes the upper limit current value on the basis of the battery deterioration state. According to such a configuration, the upper limit current value allowing the overvoltage of the battery to fall within the predetermined range can be securely determined even in a case where a deteriorating secondary battery is used.

Third Embodiment

Next, a third embodiment of the present invention is described. Unlike the second embodiment, an example where the upper limit current value is determined further in consideration of the deterioration mode with the lithium ion concentration (the offshore concentration C*) in the electrolyte solution decreasing is described in this embodiment. Note that the configuration of the battery system according to this embodiment is identical or similar to that of the battery system 100 in FIG. 1 illustrated in the first embodiment except that the configuration includes an assembled battery controller 150*b* instead of the assembled battery controller 150. Hereinafter, the details of this embodiment are described mainly on the difference between the assembled battery controllers 150 and 150*b*.

Figure 18:
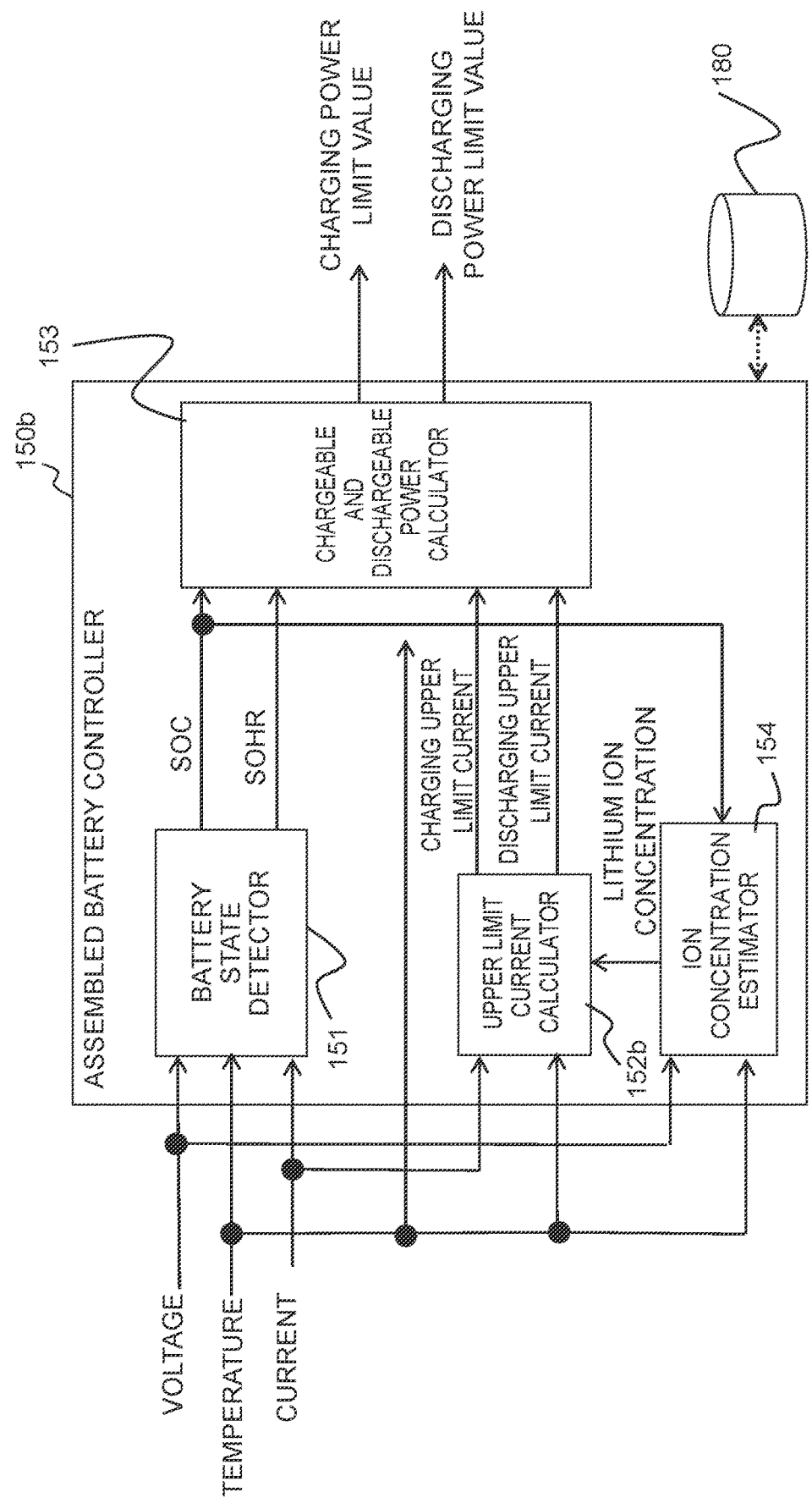
FIG. 18 shows a functional configuration of an assembled battery controller according to a third embodiment of the present invention.

FIG. 18 shows the functional configuration of the assembled battery controller 150*b* according to the third embodiment of the present invention. The assembled battery controller 150*b* in this embodiment has a functional configuration identical or similar to that of the assembled battery controller 150 in the first embodiment except that an ion concentration estimator 154 is added, and that an upper limit current calculator 152*b* is included instead of the upper limit current calculator 152 in FIG. 3, and the lithium ion concentration of each battery calculated by the ion concentration estimator 154 is input into this upper limit current calculator 152*b*.

The ion concentration estimator 154 estimates the lithium ion concentration in the electrolyte solution in each battery on the basis of the voltage, temperature and SOC of the corresponding battery. In the deterioration mode assumed in this embodiment, for the battery with the reduced lithium ions in the electrolyte solution, a lithium ion concentration lower than that in the normal state is estimated by the ion concentration estimator 154. Note that the deterioration mode (reduction in offshore lithium ion concentration) assumed in this embodiment is described later.

Similar to the upper limit current calculator 152 in the first embodiment, the upper limit current calculator 152*b* calculates the charging upper limit current and the discharging upper limit current of each battery on the basis of the current and temperature of the corresponding battery, and outputs the calculated currents. At this time, the upper limit current calculator 152*b* executes calculation of the upper limit current value according to the lithium ion concentration of each battery estimated by the ion concentration estimator 154, thereby changing the charging upper limit current and the discharging upper limit current on the basis of the change in lithium ion concentration of the corresponding battery.

Figure 19:
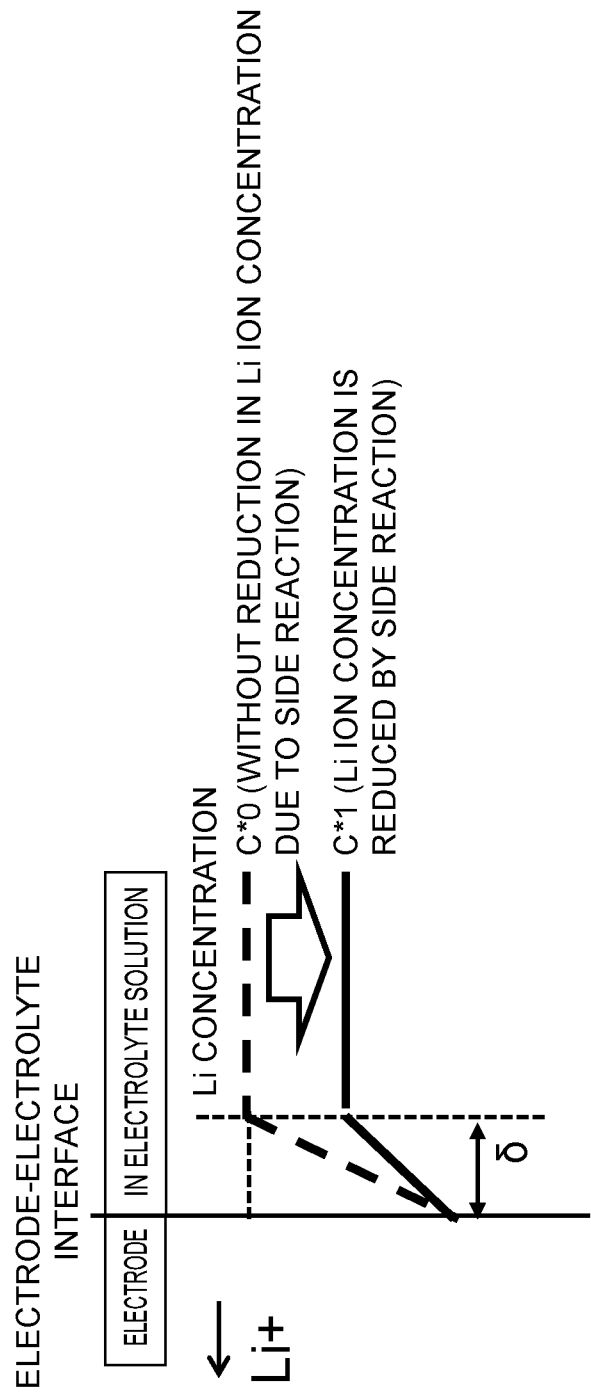
FIG. 19 illustrates a deterioration mode due to reduction in lithium ion concentration.

Hereinafter, referring to FIGS. 19 and 20, the deterioration mode (reduction in offshore lithium ion concentration) assumed in this embodiment, and change in upper limit current value are described. FIG. 19 illustrates a deterioration mode due to reduction in lithium ion concentration. If excessive charging and discharging where a large value of current continuously flows are performed particularly at a low temperature, a side reaction different from the charging and discharging reaction occurs, which reduces the lithium ions in the electrolyte solution. Here, provided that the lithium ion concentration in the normal state without deterioration is $C^*_0$, the lithium ion concentration is changed from $C^*_0$ to $C^*_1$ ($C^*_0 > C^*_1$) owing to deterioration. Provided that the thickness δ of the diffusion layer does not change from the normal state if such a deterioration mode occurs, the lithium ion concentration gradient in the diffusion layer decreases as shown in FIG. 19. Accordingly, it is assumed that a stage where diffusion of lithium ions limits the speed is more easily achieved in comparison with the normal state without deterioration.

Figure 20:
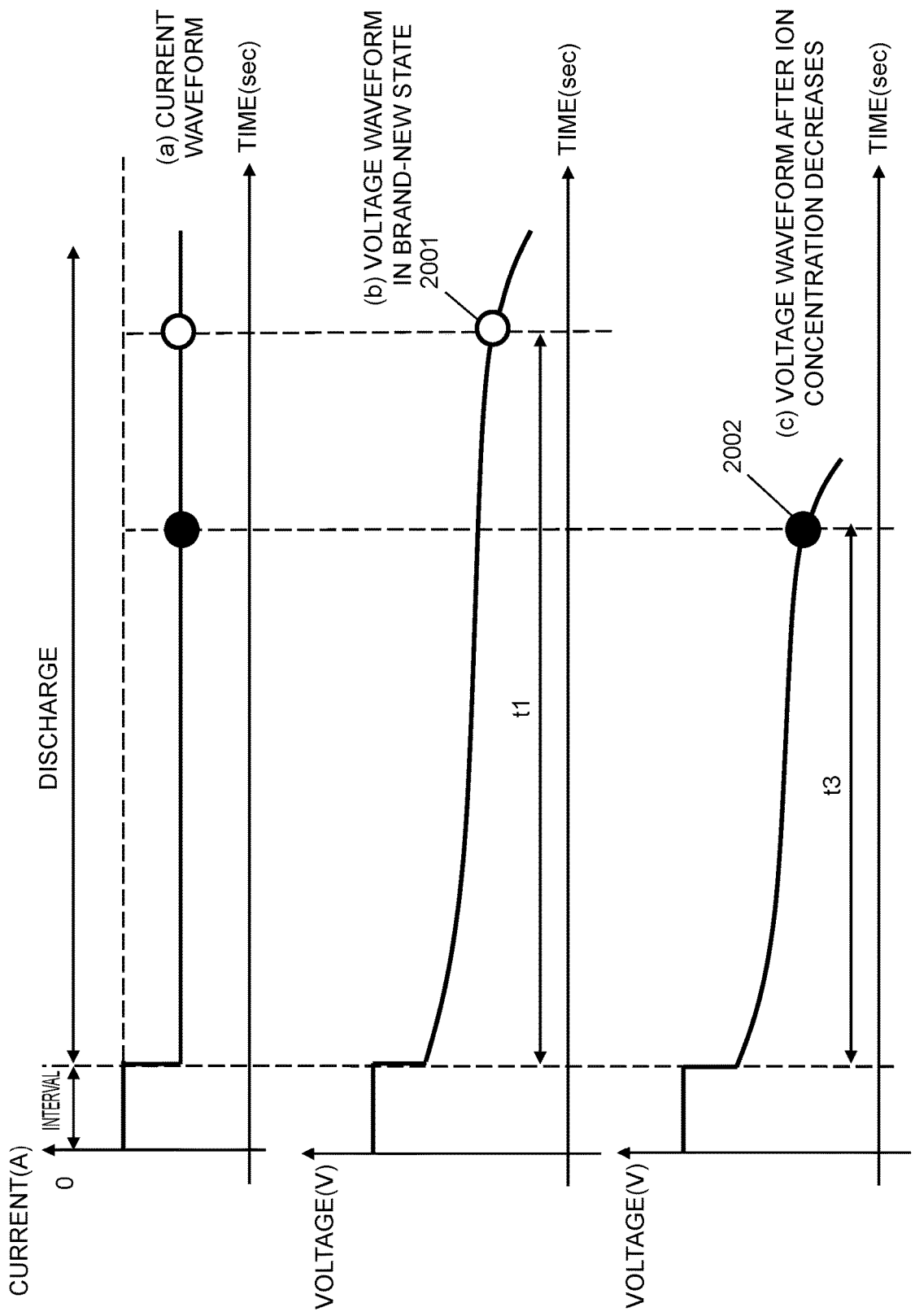
FIG. 20 illustrates change in voltage waveform due to reduction in lithium ion concentration.

FIG. 20 illustrates change in voltage waveform due to reduction in lithium ion concentration. When the battery is continuously discharged with a current waveform shown, for example, in FIG. 20(*a*) in a brand-new state where the lithium ion concentration has not decreased, the voltage of the battery changes as shown in FIG. 20(*b*). In this voltage waveform, the resistance component due to the lithium ion concentration gradient in the diffusion layer steeply increases at and after the timing indicated by reference sign 2001 after lapse of a time period t1 from start of discharging, and the battery voltage steeply decreases accordingly, as described in the first embodiment.

On the other hand, when the battery is continuously discharged with a current waveform shown in, for example, FIG. 20(*a*) in a state where the lithium ion concentration has decreased owing to deterioration, the voltage of the battery changes as shown in FIG. 20(*c*). In this voltage waveform, the stage where diffusion of lithium ions limits the speed is easily achieved owing to reduction in lithium ion concentration. Accordingly, at and after the timing indicated by reference sign 2002 after lapse of a time period t3 (t3>t1) from start of discharging, the resistance component due to the lithium ion concentration gradient in the diffusion layer steeply increases, and the battery voltage steeply decreases. That is, this shows that the increase in resistance component due to lithium ion diffusion occurs in a shorter time period than that in the brand-new state.

Accordingly, in this embodiment, the ion concentration estimator 154 is included in the assembled battery controller 150*b*, thus additionally providing the assembled battery controller 150*b* with a function of detecting reduction in lithium ion concentration, in the assembled battery controller 150*b*. Accordingly, the battery is controlled by setting the upper limit current so as to avoid the mode described above with a tendency of easily achieving the stage where diffusion of lithium ions limits the speed, even if the lithium ion concentration decreases.

Figure 21:
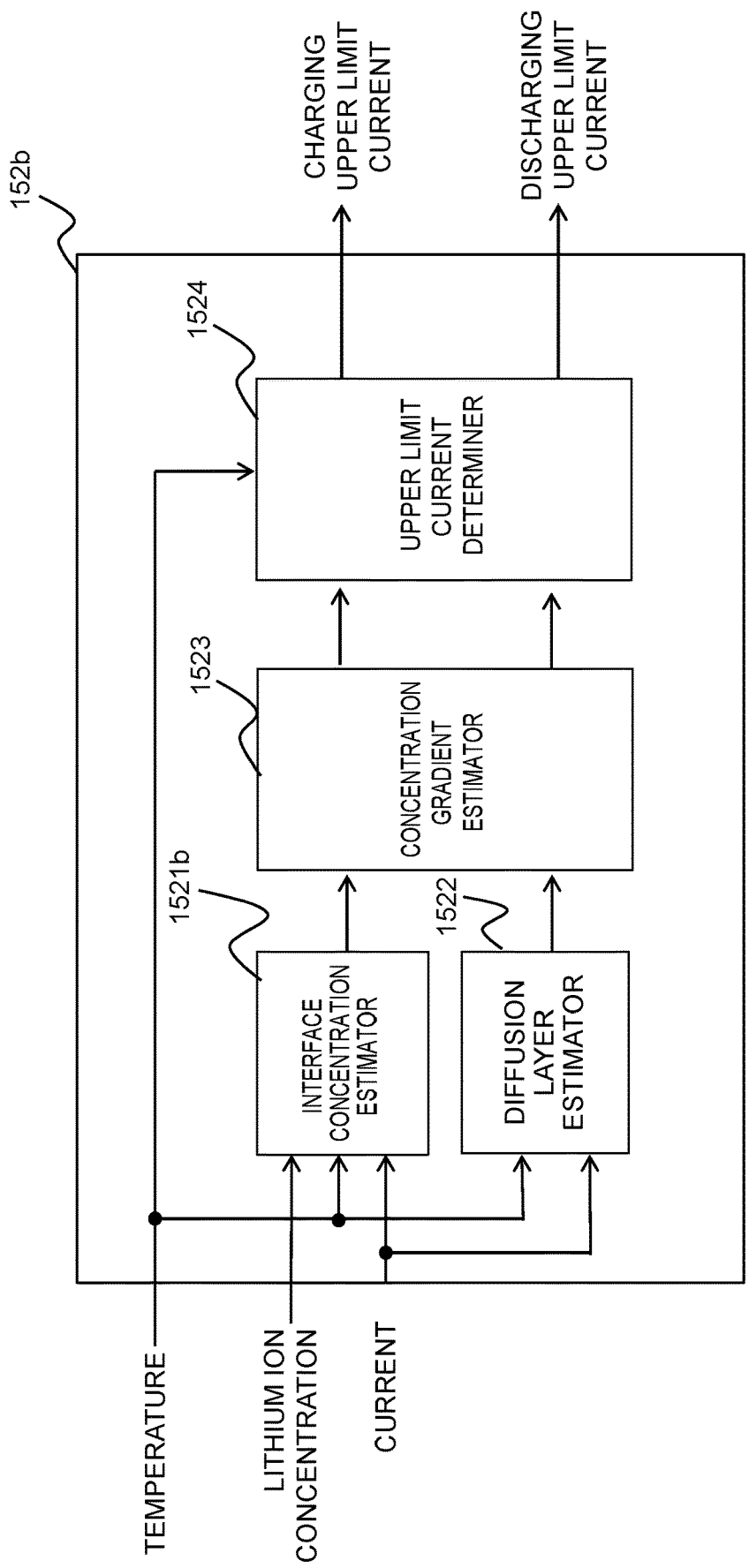
FIG. 21 is a control block diagram of an upper limit current calculator according to the third embodiment of the present invention.

FIG. 21 is the control block diagram of the upper limit current calculator 152*b* according to the third embodiment of the present invention. The upper limit current calculator 152*b* in this embodiment has a functional configuration identical or similar to that of the upper limit current calculator 152 in the first embodiment except that an interface concentration estimator 1521*b* is included instead of the interface concentration estimator 1521 of FIG. 7, and the lithium ion concentration of each battery estimated by the ion concentration estimator 154 is input into this interface concentration estimator 1521*b*.

Similar to the interface concentration estimator 1521 according to the first embodiment, the interface concentration estimator 1521*b* estimates the lithium ion concentration on the interface between the electrode and the electrolyte during charging or discharging, according to Expression (4) described above, on the basis of the current and temperature of each battery input from the current detector 130 and the unit battery manager 120 into the upper limit current calculator 152*b*. At this time, the interface concentration estimator 1521*b* replaces the value of C* in the first term of the right-hand side of Expression (4) with the lithium ion concentration input from the ion concentration estimator 154. Accordingly, if the lithium ion concentration in the entire electrolyte solution is reduced by battery deterioration, the lithium ion concentration on the interface corresponding to the deterioration state is estimated. Similar to the first embodiment, provided that the value of the diffusion constant D(T) is assumed to be constant in Expression (4) irrespective of the temperature T, the lithium ion concentration on the interface can be calculated by the interface concentration estimator 1521b on the basis only of the current and lithium ion concentration of each battery.

Figure 22:
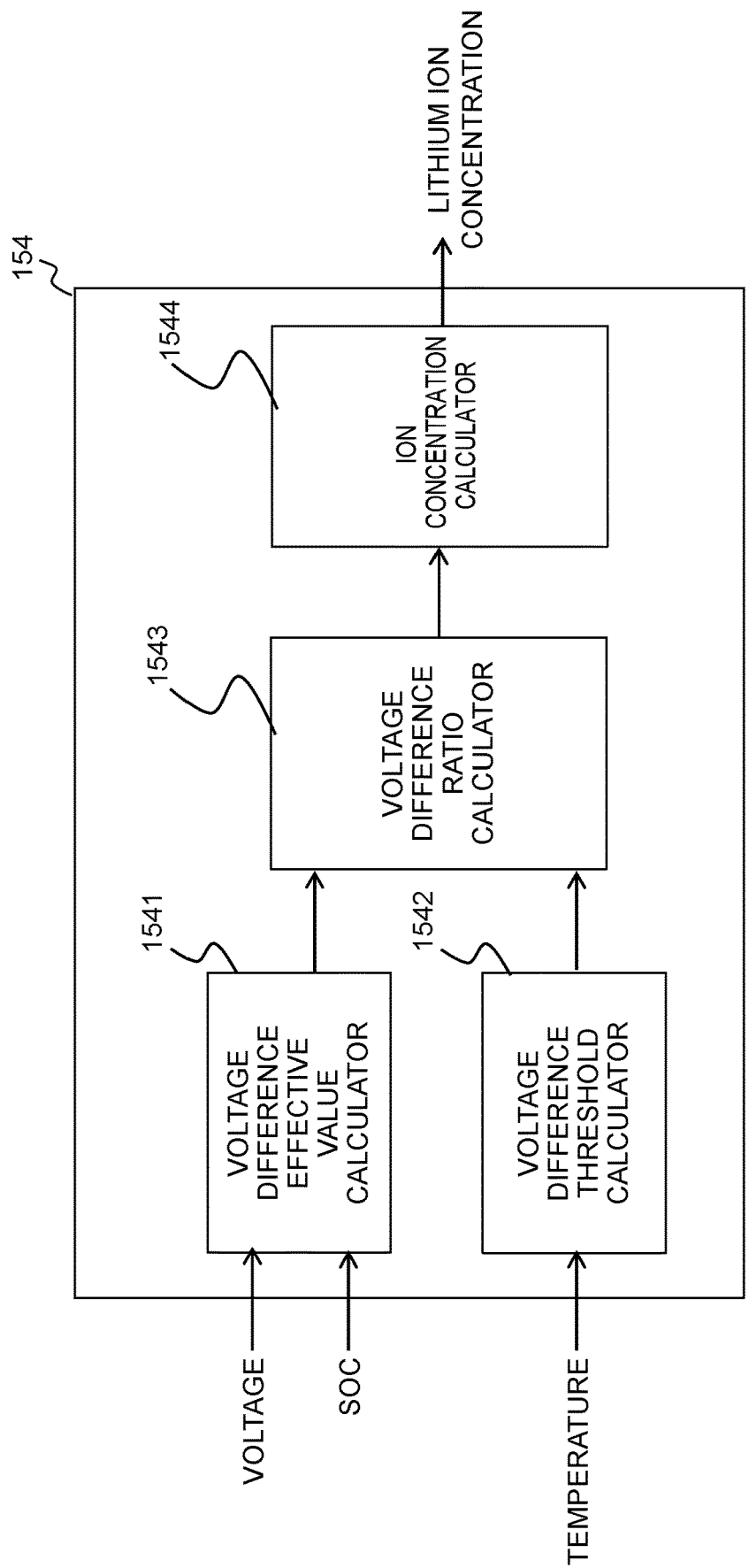
FIG. 22 is a control block diagram of an ion concentration estimator according to the third embodiment of the present invention.

FIG. 22 is a control block diagram of an ion concentration estimator 154 according to the third embodiment of the present invention. The ion concentration estimator 154 includes a voltage difference effective value calculator 1541, a voltage difference threshold calculator 1542, a voltage difference ratio calculator 1543, and an ion concentration calculator 1544.

The voltage difference effective value calculator 1541 receives the voltage and SOC as inputs, and calculates the voltage difference effective value in a preset predetermined time window. Specifically, the voltage difference effective value calculator 1541 calculates the voltage difference effective value $\Delta V_{RMS}$ according to the following Expressions (7) to (9), for example. Note that OCV in Expression (7) can be calculated from the preset correspondence relationship between SOC and OCV on the basis of the input SOC.

[Expression 6]

$$\Delta V(t) = CCV(t) - OCV(t) \quad (7)$$

$$\Delta V_{Filter}(t) = \frac{t_s}{T_w} \times \Delta V^2(t) + \left(1 - \frac{t_s}{T_w}\right) \times \Delta V_{Filter}(t - t_s) \quad (8)$$

$$\Delta V_{RMS}(t) = \sqrt{\Delta V_{Filter}(t)} \quad (9)$$

In Expressions (7) to (9), $\Delta V(t)$ represents the voltage difference [V] between CCV and OCV, which corresponds to the overvoltage of the battery. $\Delta V_{Filter}(t)$ represents a result [V²] of first-order lag filter application to $\Delta V^2(t)$, ts represents a control period [sec], Tw represents the time window [sec], and $\Delta V_{RMS}(t)$ represents the voltage difference effective value [V].

The voltage difference threshold calculator 1542 receives the temperature as an input, and calculates the threshold for the voltage difference effective value, which is to be calculated by the voltage difference effective value calculator 1541. The threshold serves as a reference for the voltage difference effective value about whether the lithium ion concentration decreases in the battery or not, and is determined according to the length of the time window with which the voltage difference effective value is calculated and to the temperature. Specifically, the voltage difference threshold calculator 1542 determines the threshold using map information preliminarily stored in the storage 180, for example. The map information represents the condition of the voltage difference effective value that prevents the phenomenon as illustrated in FIG. 20(c) from occurring, and is created on the basis of the relationship between the time window and temperature, and the voltage difference effective value, the relationship having been previously extracted by an experiment.

Figure 23:
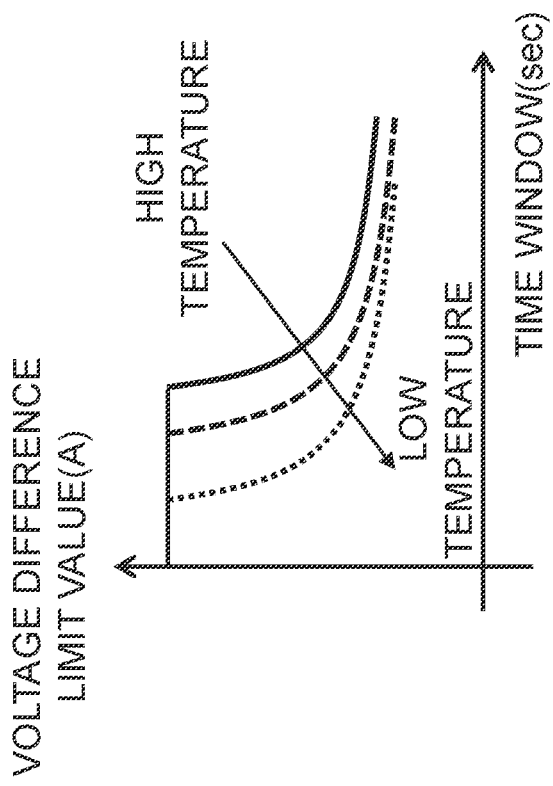
FIG. 23 shows an example of a threshold calculated by a voltage difference threshold calculator.

FIG. 23 shows an example of the threshold calculated by the voltage difference threshold calculator 1542. In this diagram, the longer the time window Tw is, or the lower the temperature is, the smaller the threshold (the limit value for the voltage difference between CCV and OCV), which is to be calculated by the voltage difference threshold calculator 1542, is. That is, the threshold is set such that the longer the charge/discharge time period is, or the lower the temperature of the battery is, the stricter the limit to the upper limit current is.

The voltage difference ratio calculator 1543 calculates the voltage difference ratio that is the ratio between the voltage difference effective value output by the voltage difference effective value calculator 1541 and the threshold output by the voltage difference threshold calculator 1542. The voltage difference ratio calculator 1543 calculates the voltage difference ratio according to the following Expression (10), for example, and outputs the ratio.

[Expression 7]

$$\Delta V_{Ratio}(t) = 100 \times \frac{\Delta V_{RMS}(t)}{\Delta V_{thresh}(t)} \quad (10)$$

In Expression (10), $\Delta V_{thresh}(t)$ represents the limit threshold [V] for the voltage difference effective value $\Delta V_{PMS}(t)$, and $\Delta V_{Ratio}(t)$ represents the voltage difference ratio [%]. Note that the voltage difference ratio $\Delta V_{Ratio}(t)$ corresponds to a load determination indicator that is a determination indicator for the load state of the battery.

The phenomenon as illustrated in FIG. 20(c) tends to easily occur under a condition where the time window is long, that is, charging or discharging continues for a long time. Accordingly, it is preferable to preset longer time windows for the voltage difference effective value calculator 1541 and the voltage difference threshold calculator 1542. That is, reduction in lithium ion concentration tends to occur when the temperature is low and charging or discharging continues for a long time. Accordingly, by presetting a longer time window, the limit for the upper limit current becomes strict, and the phenomenon described above can be securely prevented.

The ion concentration calculator 1544 estimates the lithium ion concentration on the basis of the voltage difference ratio calculated by the voltage difference ratio calculator 1543, and outputs the estimated concentration. The ion concentration calculator 1544 estimates the lithium ion concentration corresponding to the calculated result of the voltage difference ratio, using the relationship between the voltage difference ratio and the lithium ion concentration, the relationship having preliminarily been stored in the storage 180, for example.

Figure 24:
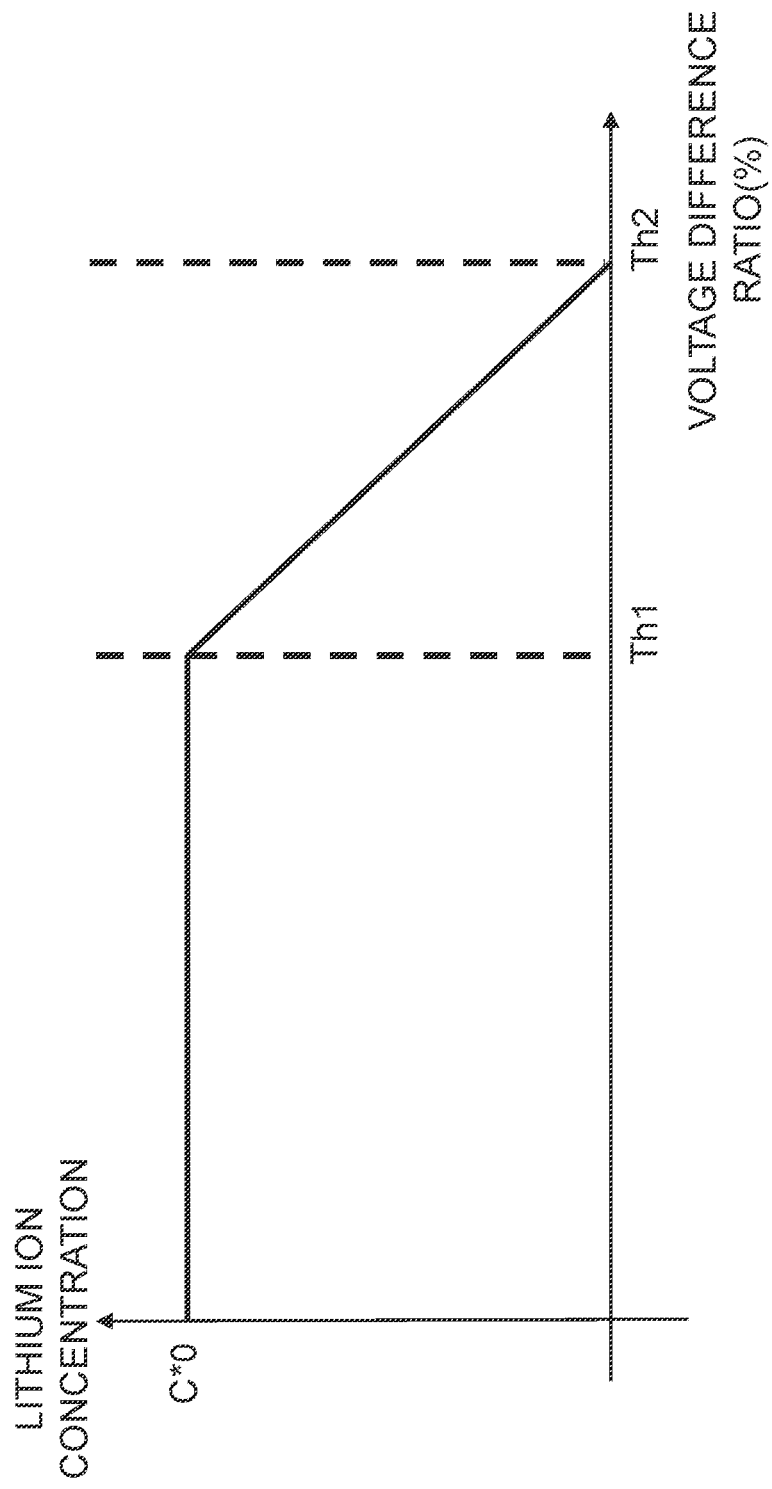
FIG. 24 shows an example of the relationship between the voltage difference ratio and the lithium ion concentration.

FIG. 24 shows an example of the relationship between the voltage difference ratio and the lithium ion concentration. In FIG. 24, the abscissa axis represents the voltage difference ratio, and the ordinate axis represents the lithium ion concentration. According to the relationship shown in FIG. 24, the lithium ion concentration starts to decrease when the voltage difference ratio exceeds a certain threshold Th1, and becomes zero at a threshold Th2.

The ion concentration estimator 154 calculates the lithium ion concentration according to the battery deterioration state, as described above. The lithium ion concentration calculated by the ion concentration estimator 154 is input into the upper limit current calculator 152b.

Figure 25:
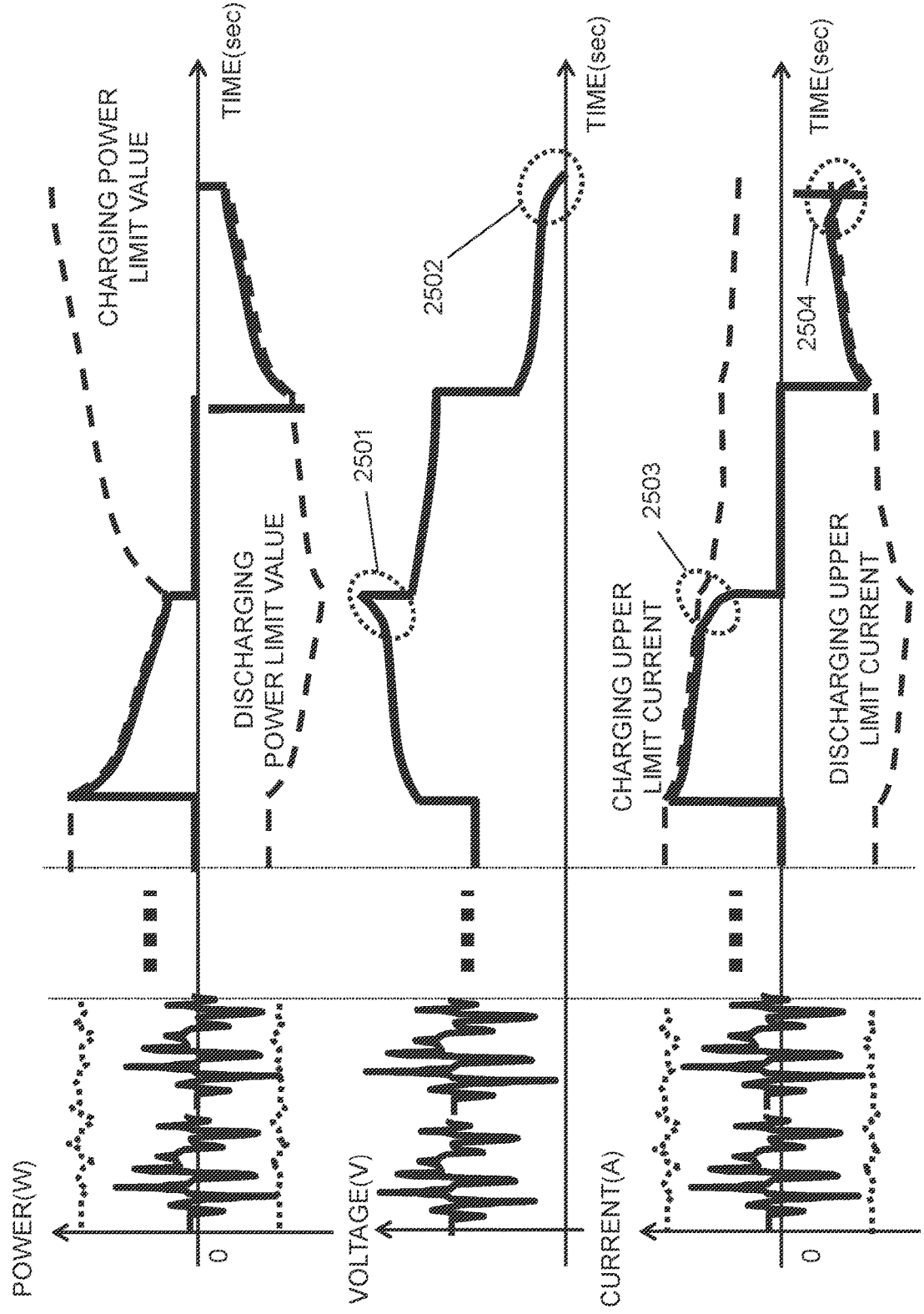
FIG. 25 shows an example of change in power, voltage and current of the battery due to the upper limit current in a case where the third embodiment of the present invention is not applied.

Next, advantageous effects of this embodiment are described with reference to FIGS. 25 and 26. FIG. 25 shows an example of change in power, voltage and current of the battery due to the upper limit current in a case where the third embodiment of the present invention is not applied. FIG. 25 shows waveform examples of the power, voltage and current in a case where the upper limit current setting method as described in this embodiment is not applied, the charging upper limit current and the discharging upper limit current are set with respect to the battery deteriorating owing to excessive charging and discharging that cause reduction in lithium ion concentration, according to the method described in the first and second embodiments, the battery is continuously charged with the charging upper limit current, and after lapse of a certain time period, and the battery is continuously discharged with the discharging upper limit current.

As illustrated in FIG. 20, if the lithium ion concentration decreases, a time period from start of battery energization to occurrence of increase in resistance component due to the lithium ion concentration gradient in the diffusion layer is shorter than that in the brand-new state. Accordingly, as shown in FIG. 25, if the charging upper limit current and the discharging upper limit current are set without application of the method of this embodiment, that is, without consideration of the reduction in lithium ion concentration, reduction in lithium ion concentration cannot be detected through charging and discharging with no limitation performed with a power lower than the charging power limit value or the discharging power limit value corresponding thereto. Consequently, in the first continuous charging subsequently performed with the charging power limit value, when a certain time period elapses after start of charging, increase in resistance due to the lithium ion concentration gradient in the diffusion layer increases the voltage, as indicated by reference sign 2501. As a result, as indicated by reference sign 2503, the current value decreases by the amount of increase in voltage. Likewise, also in a case of continuous discharging performed with the discharging power limit value after charging, as indicated by reference sign 2502, the voltage is reduced by increase in resistance due to the lithium ion concentration gradient in the diffusion layer when a certain time period elapses after start of discharging. As a result, as indicated by reference sign 2504, the current increases by the amount of reduction in voltage, and exceeds the upper limit current. In such a case, similar to the case described in the first embodiment where the charging upper limit current and the discharging upper limit current have the certain values, and to the case described in the second embodiment where the charging upper limit current and the discharging upper limit current are set without consideration of battery deterioration, the power chargeable in the battery decreases on the charging side. There is a concern that at worst, charging cannot be made although SOC is low. On the contrary, on the discharging side, a high current flows. Accordingly, there is a concern that heat generation and deterioration of the battery accelerate, and the performance of the battery cannot be utilized to the maximum.

Figure 26:
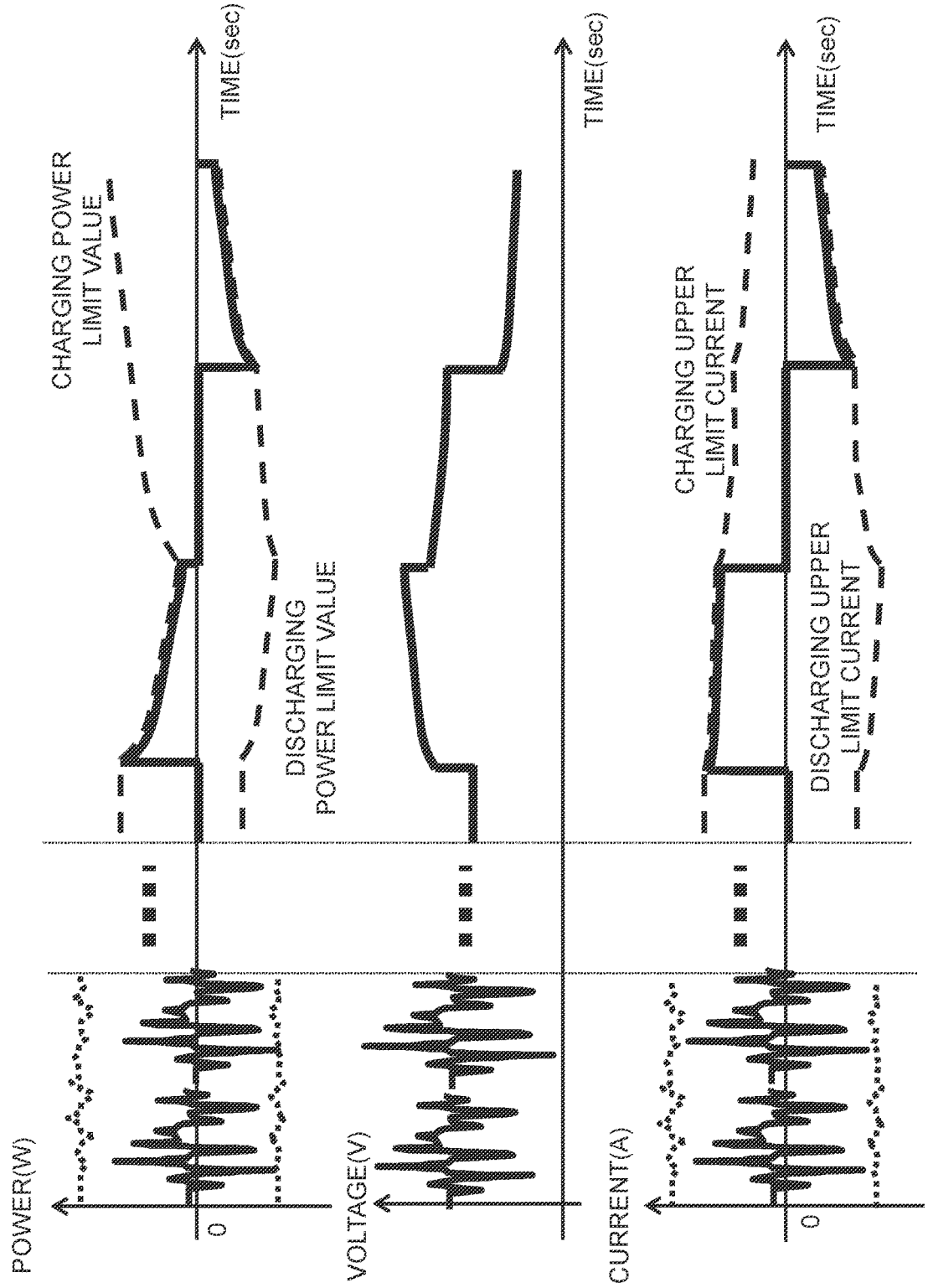
FIG. 26 shows an example of change in power, voltage and current of the battery due to the upper limit current in a case where the third embodiment of the present invention is applied.

FIG. 26 shows an example of change in power, voltage and current of the battery due to the upper limit current in the case where the third embodiment of the present invention is applied. FIG. 26 shows waveform examples of the power, voltage and current in a case where reduction in lithium ion concentration due to charging or discharging with no limitation is detected, the charging upper limit current and the discharging upper limit current are set such that the detected reduction is reflected, and the battery is continuously charged with the charging upper limit current, and after lapse of a certain time period, the battery is continuously discharged with the discharging upper limit current, according to the method of setting the upper limit current in this embodiment as described above.

As shown in FIG. 26, in the case where the charging upper limit current and the discharging upper limit current are set by applying the method of this embodiment, the battery is charged and discharged with the power based on the result of real-time estimation of the upper limit current value that can suppress increase in resistance due to the lithium ion concentration gradient in the diffusion layer; the estimation is made according to the state where the lithium ion concentration decreases. Accordingly, on each of the charging and discharging sides, the battery can be charged and discharged while suppressing steep change in voltage due to increase in diffusion resistance. As a result, even if the lithium ion concentration in the battery decreases, increase in voltage during charging and reduction in voltage during discharging as in FIG. 25 do not occur. Resultantly, the charging performance can be prevented from decreasing, heat generation and deterioration during discharging can be suppressed, and the performance of the battery can be utilized to the maximum.

As described above, according to the third embodiment of the present invention, also in a case where the secondary battery with the lithium ion concentration reduced owing to deterioration is used, the input and output performance of the battery can be utilized to the maximum, while avoiding the region where the voltage of the secondary battery steeply changes.

Note that in the embodiment described above, as for the calculation process performed by the ion concentration estimator 154, the example is described where the first-order lag filter is applied to the square value of the overvoltage (CCV-OCV) by Expressions (7) and (8) described above, and the result thereof is used to calculate the voltage difference ratio according to Expressions (9) and (10). However, the calculation process performed by the ion concentration estimator 154 is not limited thereto. Alternatively, for example, the square value of current may be used instead of that of the overvoltage. In this case, also as for the threshold used in Expression (10) calculated by the voltage difference threshold calculator 1542, it is preferable to adopt a threshold corresponding to the effective value of current instead of the threshold for the effective value of the voltage difference as exemplified in FIG. 23. Accordingly, current-based control can be used instead of the overvoltage-based control. That is, the ion concentration estimator 154 can estimate the lithium ion concentration, based on an effective value of an overvoltage or a current of the battery.

In this embodiment, the method of simply detecting reduction in lithium ion concentration on the basis of the result of the preliminarily performed experiment has been described. However, the present invention is not limited thereto. For example, generation of a lithium compound due to a lithium ion side reaction may be modeled, reduction in the amount of lithium ions in the battery may be estimated, and the estimation result may be reflected in Expression (4), thereby estimating the lithium ion concentration on the interface between the electrode and the electrolyte.

The third embodiment of the present invention described above further exerts the following working effects, in addition to those described in the first embodiment.

(6) The assembled battery controller 150*b* includes the ion concentration estimator 154 that estimates the lithium ion concentration in the battery. In the upper limit current calculator 152*b*, the upper limit current determiner 1524 changes the upper limit current value on the basis of change in lithium ion concentration estimated by the ion concentration estimator 154. According to such a configuration, the upper limit current value allowing the overvoltage of the battery to fall within the predetermined range can be securely determined even in a case where a secondary battery with a lithium ion concentration reduced by deterioration is used.

(7) The ion concentration estimator 154 estimates the lithium ion concentration of the battery, based on an effective value of an overvoltage or a current of the battery. According to such a configuration, when excessive charging or discharging is performed to reduce the lithium ion concentration of the battery, the reduction can be securely detected.

Fourth Embodiment

Next, a fourth embodiment of the present invention is described. In this embodiment, an example is described where according to a method different from that in the third embodiment, charge and discharge control is performed for the battery with a reduced lithium ion concentration. Note that the configuration of the battery system according to this embodiment is identical or similar to that of the battery system 100 in FIG. 1 illustrated in the first embodiment except that the configuration includes an assembled battery controller 150c instead of the assembled battery controller 150. Hereinafter, the details of this embodiment are described mainly on the difference between the assembled battery controllers 150 and 150c.

Figure 27:
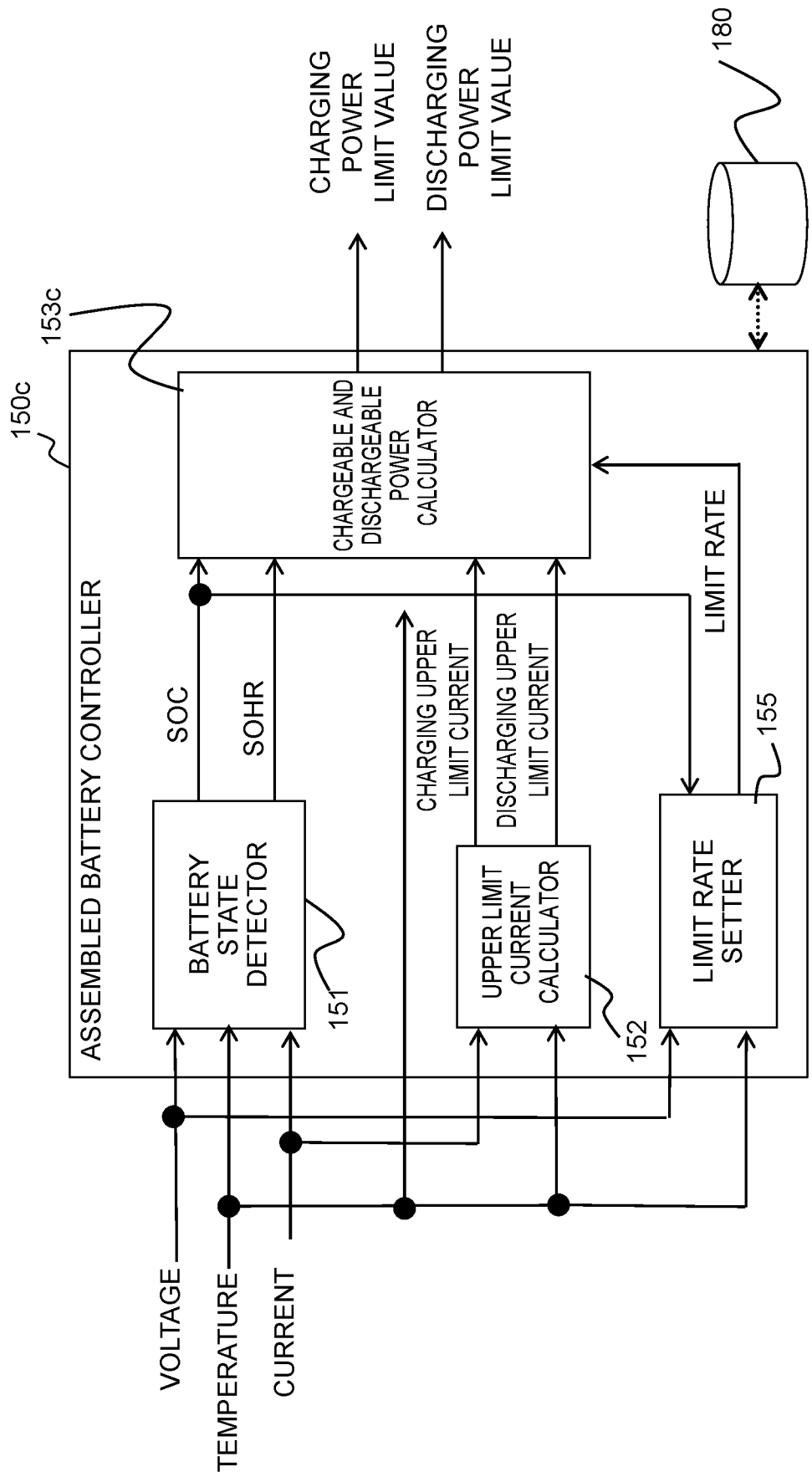
FIG. 27 shows a functional configuration of an assembled battery controller according to a fourth embodiment of the present invention.

FIG. 27 shows the functional configuration of the assembled battery controller 150c according to the fourth embodiment of the present invention. The assembled battery controller 150c in this embodiment has a functional configuration identical or similar to that of the assembled battery controller 150 according to the first embodiment except that the limit rate setter 155 is added, and that a chargeable and dischargeable power calculator 153c is included instead of the chargeable and dischargeable power calculator 153 in FIG. 3, and a limit rate set by the limit rate setter 155 is input into this chargeable and dischargeable power calculator 153c.

The limit rate setter 155 sets a limit rate according to change in lithium ion concentration in the electrolyte solution in each battery on the basis of the voltage, temperature and SOC of the corresponding battery. Similar to the lithium ion concentration estimated in the ion concentration estimator 154 in the third embodiment, the deterioration state of each battery is reflected in the limit rate set by the limit rate setter 155. That is, for the battery with lithium ions in the electrolyte solution reduced by deterioration, the limit rate different from that in the normal state is set by the limit rate setter 155.

Similar to the chargeable and dischargeable power calculator 153 in the first embodiment, the chargeable and dischargeable power calculator 153c calculates the chargeable power and the dischargeable power of each battery on the basis of the SOC and SOHR of each battery calculated by the battery state detector 151, the temperature of each battery input into the assembled battery controller 150, and the charging power limit value and the discharging upper limit current of each battery calculated by the upper limit current calculator 152, and outputs the calculated powers. At this time, the chargeable and dischargeable power calculator 153c changes the chargeable power and the dischargeable power according to change in lithium ion concentration in each battery, on the basis of the limit rate set by the limit rate setter 155.

Figure 28:
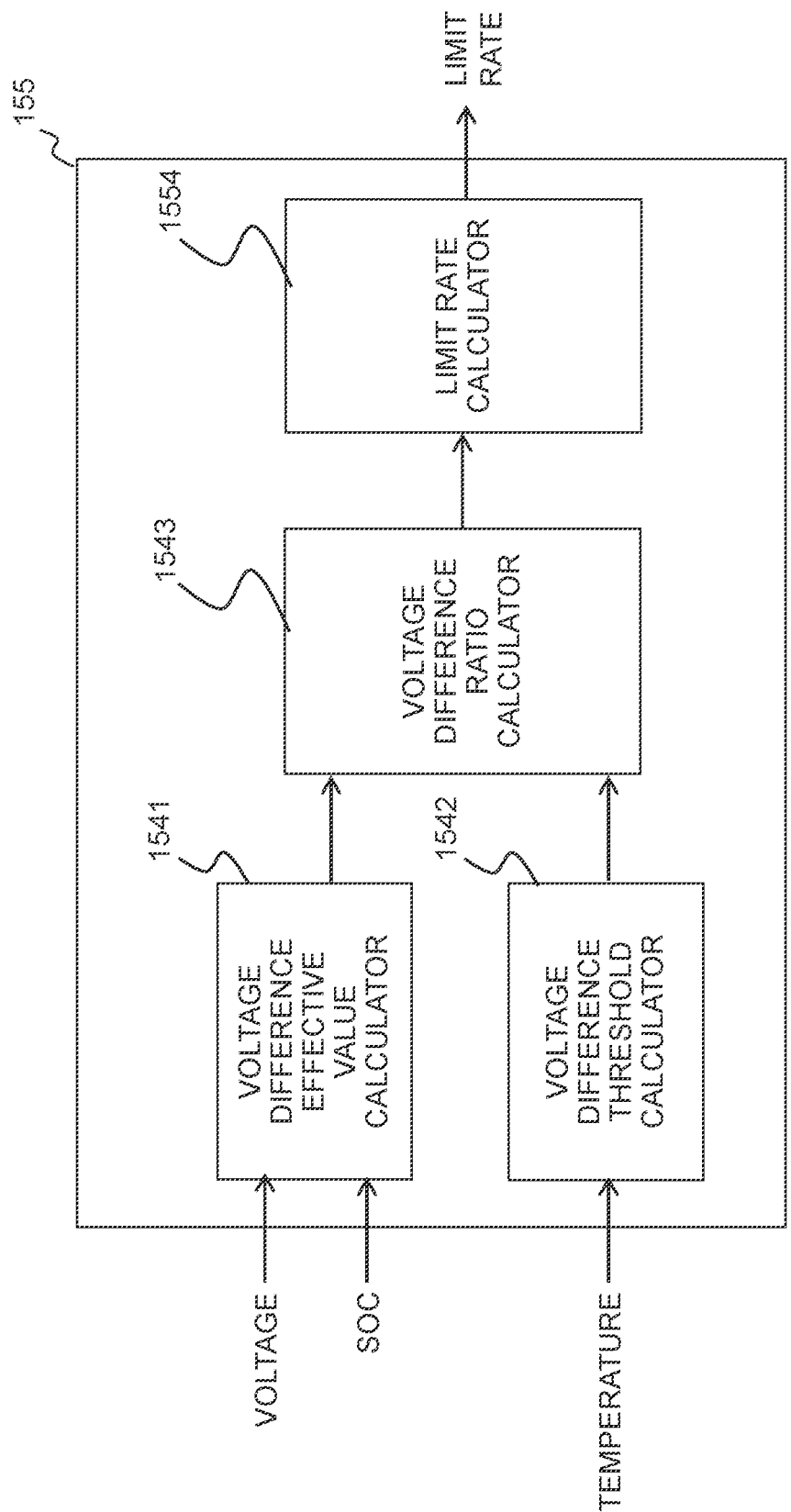
FIG. 28 is a control block diagram of limit rate setter according to the fourth embodiment of the present invention.

FIG. 28 is the control block diagram of limit rate setter 155 according to the fourth embodiment of the present invention. The limit rate setter 155 includes a voltage difference effective value calculator 1541, a voltage difference threshold calculator 1542, a voltage difference ratio calculator 1543, and a limit rate calculator 1554. Note that the voltage difference effective value calculator 1541, the voltage difference threshold calculator 1542 and the voltage difference ratio calculator 1543 are identical or similar to those included in the ion concentration estimator 154 shown in FIG. 22 in the third embodiment.

The limit rate calculator 1554 sets the limit rate for each of the chargeable power and the dischargeable power, on the basis of the voltage difference ratio calculated by the voltage difference ratio calculator 1543. The limit rate calculator 1554 calculates a limit rate k corresponding to the calculation result of the voltage difference ratio, using the relationship between the voltage difference ratio and the limit rate preliminarily stored in the storage 180, for example.

FIG. 29 shows an example of the relationship between the voltage difference ratio and the limit rate. In FIG. 29, the abscissa axis represents the voltage difference ratio, and the ordinate axis represents the limit rate. According to the relationship shown in FIG. 29, the value of the limit rate starts to decrease after a point where the voltage difference ratio exceeds a certain threshold Th1. Accordingly, the limit to the chargeable power and the dischargeable power becomes strict. The limit rate becomes zero with a threshold Th2. Accordingly, charge and discharge are prohibited.

As described above, when the lithium ion concentration is reduced by deterioration, the limit rate setter 155 sets the limit rate corresponding to the lithium ion concentration. The limit rate k set by the limit rate setter 155 is input into the chargeable and dischargeable power calculator 153c.

For example, according to the following Expressions (11) and (12), the chargeable and dischargeable power calculator 153c changes the chargeable power and the dischargeable power by multiplying the limit rate k input from the limit rate setter 155 by the chargeable power and the dischargeable power. Note that only one of the chargeable power and the dischargeable power may be changed using Expression (11) or (12).

[Expression 8]

$$W'_{chg}(t) = k \times W_{chg}(t) \tag{11}$$

$$W'_{chg}(t) = k \times W_{chg}(t) \tag{12}$$

As described above, according to this embodiment, the chargeable power and the dischargeable power are changed on the basis of the change in lithium ion concentration in the battery. As a result, in the third embodiment, advantageous effects identical or similar to those illustrated in FIGS. 25 and 26 can be exerted. Accordingly, also in a case where the secondary battery with the lithium ion concentration reduced owing to deterioration is used, the input and output performance of the battery can be utilized to the maximum, while avoiding the region where the voltage of the secondary battery steeply changes.

Similar to the case in the third embodiment, also in this embodiment, the square value of current may be used instead of the overvoltage in the calculation process performed by the limit rate setter 155.

The fourth embodiment of the present invention described above further exerts the following working effects, in addition to those described in the first embodiment.

(8) The chargeable and dischargeable power calculator 153c changes the chargeable power or the dischargeable power according to change in the lithium ion concentration of the battery. According to such a configuration, the chargeable power or the dischargeable power during upper limit current energization can be appropriately set such that the overvoltage of the battery falls within the predetermined range even in a case where a secondary battery with a lithium ion concentration reduced by deterioration is used.

(9) The assembled battery controller 150c includes the limit rate setter 155 that sets the limit rate according to change in the lithium ion concentration of the battery, based on the effective value of the overvoltage or the current of the battery. The chargeable and dischargeable power calculator 153c changes the chargeable power or the dischargeable power, based on the limit rate set by the limit rate setter 155. According to such a configuration, when excessive charging or discharging is performed to reduce the lithium ion concentration of the battery, the chargeable power or the dischargeable power corresponding thereto can be securely determined.

Note that in the embodiments described above, the examples have been described where charge and discharge control is performed on the basis of the lithium ion concentration in the diffusion layer formed around the interface between the electrode and the electrolyte in the case of using the lithium ion battery as the secondary battery. Alternatively, also in a case of using another secondary battery, identical or similar charge and discharge control can be performed. That is, without limitation to lithium ions, also for any other ions, the present invention is applicable to a case where charge and discharge control is performed on the basis of the ion concentration in the diffusion layer formed around the interface between the electrode and the electrolyte.

Note that the embodiments and various modification examples described above are only examples. The present invention is not limited to the details of them unless the characteristics of the invention are degraded. Each of the embodiments can be freely combined and used. The various embodiments or the modification examples have thus been described above. However, the present invention is not limited to the details of them. Other aspects conceivable in the range of the technical thought of the present invention are also encompassed by the present invention.

REFERENCE SIGNS LIST

100: Battery system
110: Assembled battery
111: Unit battery
112: Unit battery group
120: Unit battery manager
121: Unit battery controller
122: Voltage detection circuit
123: Control circuit
124: Signal input and output circuit
125: Temperature detector
130: Current detector
140: Voltage detector
150, 150a, 150b, 150c: Assembled battery controller
151: Battery state detector
152, 152a, 152b: Upper limit current calculator
153, 153c: Chargeable and dischargeable power calculator
154: ion concentration estimator
155: Limit rate setter
160: Signal communication means
170: insulation element
180: Storage
200: Vehicle controller
300 to 330: Relay
400: inverter
410: Motor generator
1521, 1521b: Interface concentration estimator
1522: Diffusion layer estimator
1523: Concentration gradient estimator
1524, 1524a: Upper limit current determiner
1541: Voltage difference effective value calculator
1542: Voltage difference threshold calculator
1543: Voltage difference ratio calculator
1544: Ion concentration calculator
1554: Limit rate calculator

The invention claimed is:

1. A battery control apparatus, comprising:
a first circuit structured to acquire data indicative of a current flowing in a secondary battery from a current detector;
a concentration gradient estimator that estimates an ion concentration gradient in a diffusion layer formed around an interface between an electrode and an electrolyte of the secondary battery, based on the current flowing in the secondary battery, or on the current and a temperature of the secondary battery; and
an upper limit current determiner that determines an upper limit current value of the secondary battery, based on the ion concentration gradient,
wherein the upper limit current determiner determines the upper limit current value such that an overvoltage of the secondary battery according to the ion concentration gradient falls within a predetermined range; and
a second circuit structured to provide an instruction to limit at least one of charging or discharging the secondary battery based on the upper limit current value.

2. The battery control apparatus according to claim 1, wherein the upper limit current determiner determines the upper limit current value such that a rate of a resistance component according to the ion concentration gradient in an internal resistance of the secondary battery falls within a predetermined range.

3. The battery control apparatus according to claim 1, wherein the upper limit current determiner determines the upper limit current value so as to maximize a charging power or a discharging power of the secondary battery.

4. The battery control apparatus according to claim 3, wherein the upper limit current determiner determines the upper limit current value so as to reduce the upper limit current value according to a lapse of an energization time period of the secondary battery.

5. The battery control apparatus according to claim 1, further comprising:
an interface concentration estimator that estimates an ion concentration on the interface; and
a diffusion layer estimator that estimates a thickness of the diffusion layer,
wherein the concentration gradient estimator estimates the ion concentration gradient, based on the ion concentration on the interface estimated by the interface concentration estimator, and on the thickness of the diffusion layer estimated by the diffusion layer estimator.

6. The battery control apparatus according to claim 1, further comprising
a chargeable and dischargeable power calculator that estimates a voltage of the secondary battery during upper limit current energization, based on the upper limit current value determined by the upper limit current determiner, and estimates a chargeable power and a dischargeable power of the secondary battery, based on the estimated voltage and upper limit current value.

7. The battery control apparatus according to claim 6, wherein the chargeable and dischargeable power calculator changes the chargeable power or the dischargeable power according to change in an ion concentration of the secondary battery.

8. The battery control apparatus according to claim 7, further comprising
a limit rate setter that sets a limit rate according to change in the ion concentration of the secondary battery, based on an effective value of an overvoltage or a current of the secondary battery,
wherein the chargeable and dischargeable power calculator changes the chargeable power or the dischargeable power, based on the limit rate set by the limit rate setter.

9. The battery control apparatus according to claim 1, wherein the upper limit current determiner changes the upper limit current value, based on a deterioration state of the secondary battery.

10. The battery control apparatus according to claim 1, further comprising
an ion concentration estimator that estimates an ion concentration of the secondary battery,
wherein the upper limit current determiner changes the upper limit current value, based on change in the ion concentration.

11. The battery control apparatus according to claim 10, wherein the ion concentration estimator estimates the ion concentration, based on an effective value of an overvoltage or a current of the secondary battery.

* * * * *